US010229924B2

(12) United States Patent
Sakamoto et al.

(10) Patent No.: US 10,229,924 B2
(45) Date of Patent: Mar. 12, 2019

(54) SEMICONDUCTOR MEMORY DEVICE

(71) Applicant: Toshiba Memory Corporation, Minato-ku (JP)

(72) Inventors: Wataru Sakamoto, Yokkaichi (JP); Tatsuya Kato, Yokkaichi (JP); Yuta Watanabe, Yokkaichi (JP); Katsuyuki Sekine, Yokkaichi (JP); Toshiyuki Iwamoto, Mie (JP); Fumitaka Arai, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/686,292

(22) Filed: Aug. 25, 2017

(65) Prior Publication Data

US 2017/0352672 A1 Dec. 7, 2017

Related U.S. Application Data

(63) Continuation of application No. PCT/JP2015/056843, filed on Mar. 9, 2015.

(51) Int. Cl.
*H01L 23/52* (2006.01)
*H01L 27/11556* (2017.01)
(Continued)

(52) U.S. Cl.
CPC ...... *H01L 27/11556* (2013.01); *H01L 23/528* (2013.01); *H01L 27/11521* (2013.01)

(58) Field of Classification Search
CPC .......................... H01L 27/11556; H01L 23/528
(Continued)

(56) References Cited

U.S. PATENT DOCUMENTS

2010/0202206 A1 8/2010 Seol et al.
2010/0207193 A1 8/2010 Tanaka et al.
(Continued)

FOREIGN PATENT DOCUMENTS

JP 2010-187000 8/2010
JP 2010-192517 9/2010
(Continued)

OTHER PUBLICATIONS

International Search Report dated Apr. 7, 2015 in PCT/JP2015/056843 filed on Mar. 9, 2015 (with English Translation).
(Continued)

*Primary Examiner* — Vu A Vu
(74) *Attorney, Agent, or Firm* — Oblon, McClelland, Maier & Neustadt, L.L.P.

(57) ABSTRACT

A semiconductor memory device according to an embodiment includes first and second semiconductor pillars extending in a first direction and being arranged along a second direction, first and second interconnects extending in a third direction and being provided between the first semiconductor pillar and the second semiconductor pillar, a first electrode provided between the first semiconductor pillar and the first interconnect, a second electrode provided between the second semiconductor pillar and the second interconnect, third and fourth interconnects extending in the second direction, a first contact contacting the first semiconductor pillar and being connected to the third interconnect, and a second contact contacting the second semiconductor pillar and being connected to the fourth interconnect. The third and fourth interconnects each pass through both a region directly above the first semiconductor pillar and a region directly above the second semiconductor pillar.

8 Claims, 20 Drawing Sheets

(51) Int. Cl.
*H01L 23/528* (2006.01)
*H01L 27/11521* (2017.01)

(58) Field of Classification Search
USPC .......................................................... 257/773
See application file for complete search history.

(56) References Cited

U.S. PATENT DOCUMENTS

| | | | |
|---|---|---|---|
| 2011/0291172 A1* | 12/2011 | Hwang | H01L 27/11578 257/314 |
| 2012/0320652 A1 | 12/2012 | Kono | |
| 2013/0003433 A1 | 1/2013 | Hishida et al. | |
| 2013/0221423 A1 | 8/2013 | Kawasaki et al. | |
| 2014/0291798 A1 | 10/2014 | Hishida et al. | |
| 2015/0200199 A1 | 7/2015 | Sakamoto et al. | |
| 2017/0345837 A1* | 11/2017 | Mori | H01L 27/11524 |

FOREIGN PATENT DOCUMENTS

| | | |
|---|---|---|
| JP | 2011-192879 | 9/2011 |
| JP | 2013-004778 | 1/2013 |
| JP | 2013-012553 | 1/2013 |
| JP | 2013-182949 | 9/2013 |

OTHER PUBLICATIONS

Written Opinion dated Apr. 7, 2015 in PCT/JP2015/056843 filed on Mar. 9, 2015.

* cited by examiner

SEMICONDUCTOR MEMORY DEVICE

CROSS-REFERENCE TO RELATED APPLICATION

This is a continuation application of International Application PCT/JP2015/056843, filed on Mar. 9, 2015; the entire contents of which are incorporated herein by reference.

FIELD

Embodiments relate to a semiconductor memory device.

BACKGROUND

Conventionally, in NAND flash memory, the bit cost has been reduced by increasing the integration by downscaling the planar structure; but the downscaling of the planar structure is approaching a limit. Therefore, in recent years, technology has been proposed to stack the memory cells in the vertical direction. However, the ease of manufacturing and the reliability of the product are challenges for such a stacked type memory device.

DETAILED DESCRIPTION

A semiconductor memory device according to an embodiment includes first and second semiconductor pillars extending in a first direction and being arranged along a second direction crossing the first direction, first and second interconnects extending in a third direction and being provided between the first semiconductor pillar and the second semiconductor pillar, a first electrode provided between the first semiconductor pillar and the first interconnect, a second electrode provided between the second semiconductor pillar and the second interconnect, third and fourth interconnects extending in the second direction, a first contact contacting the first semiconductor pillar and being connected to the third interconnect, and a second contact contacting the second semiconductor pillar and being connected to the fourth interconnect. The third direction crosses both the first direction and the second direction. The third and fourth interconnects each pass through both a region directly above the first semiconductor pillar and a region directly above the second semiconductor pillar.

First Embodiment

First, a first embodiment will be described.

Figure 1A:
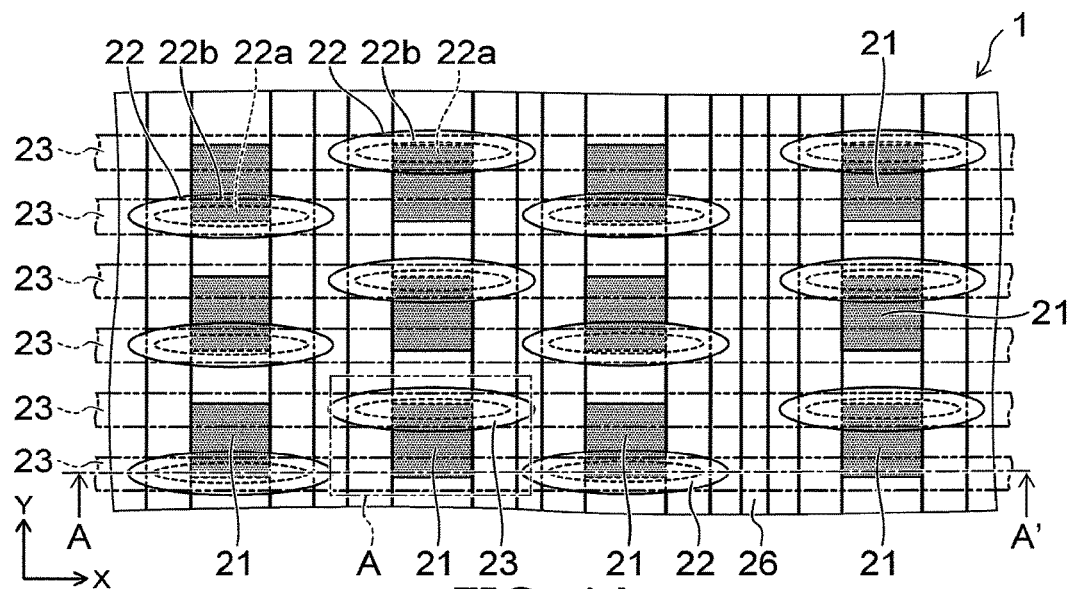
FIG. 1A is a plan view showing a semiconductor memory device according to a first embodiment.
Figure 1B:
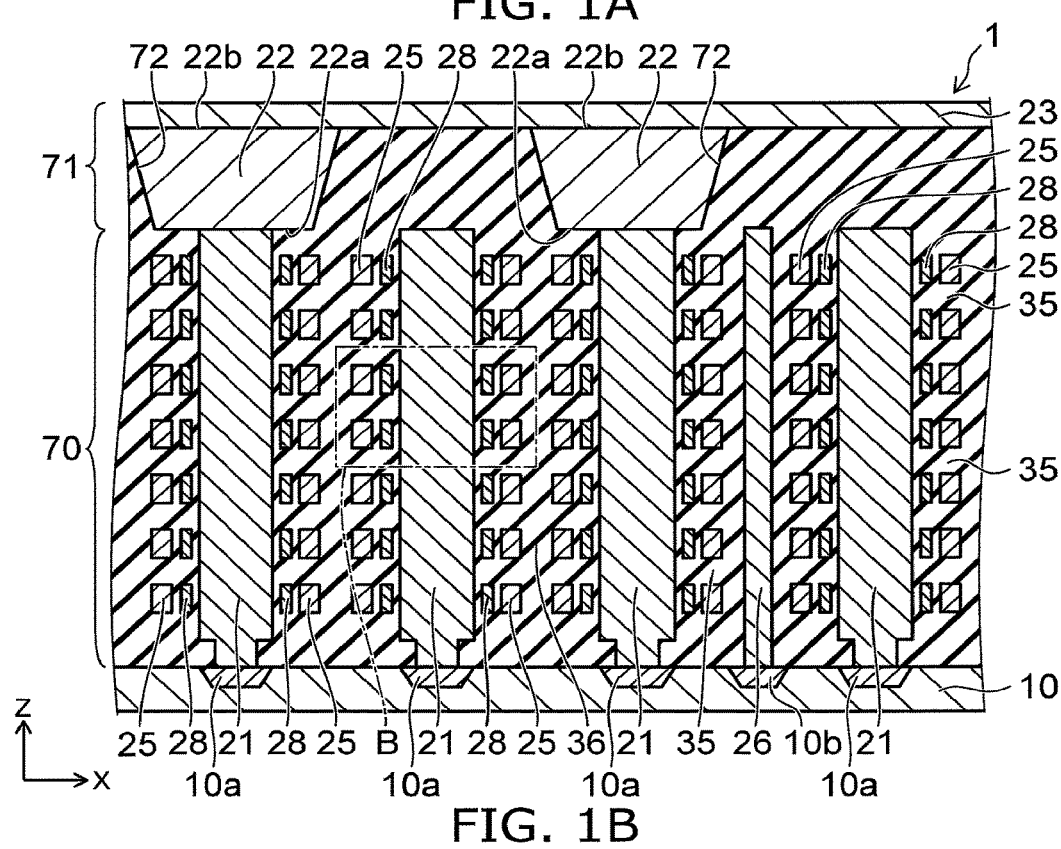
FIG. 1B is a cross-sectional view along line A-A' shown in FIG. 1A.

FIG. 1A is a plan view showing a semiconductor memory device according to the embodiment; and FIG. 1B is a cross-sectional view along line A-A' shown in FIG. 1A.

Figure 2A:
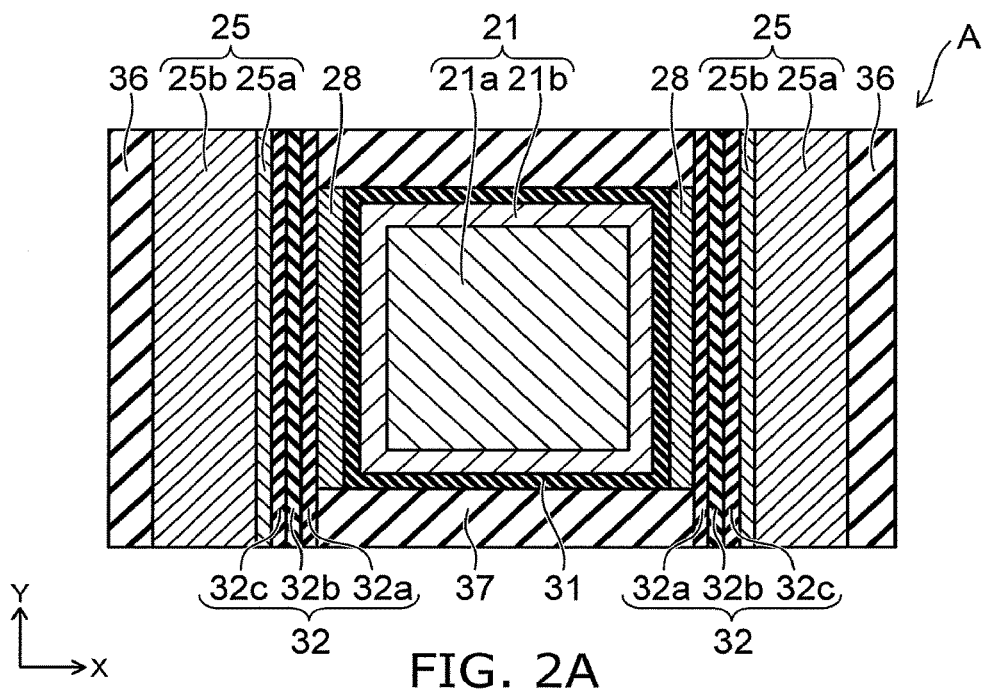
FIG. 2A is a partially enlarged cross-sectional view corresponding to region A of FIG. 1A.
Figure 2B:
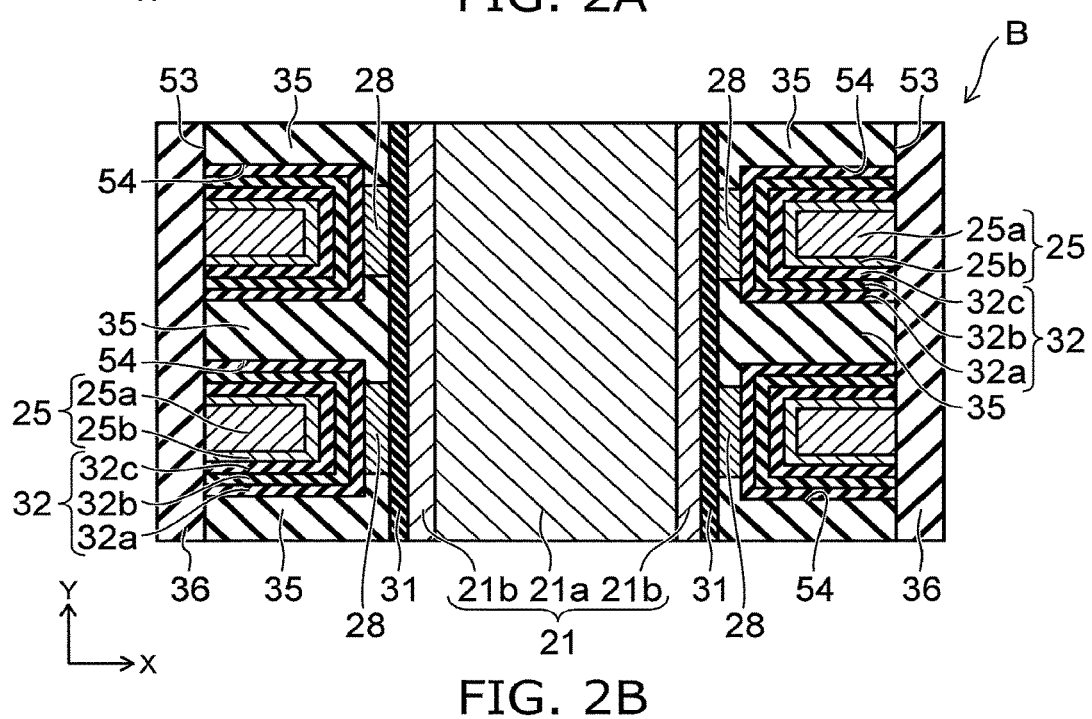
FIG. 2B is a partially enlarged cross-sectional view showing region B of FIG. 1B.

FIG. 2A is a partially enlarged cross-sectional view corresponding to region A of FIG. 1A; and FIG. 2B is a partially enlarged cross-sectional view showing region B of FIG. 1B.

Figure 3:
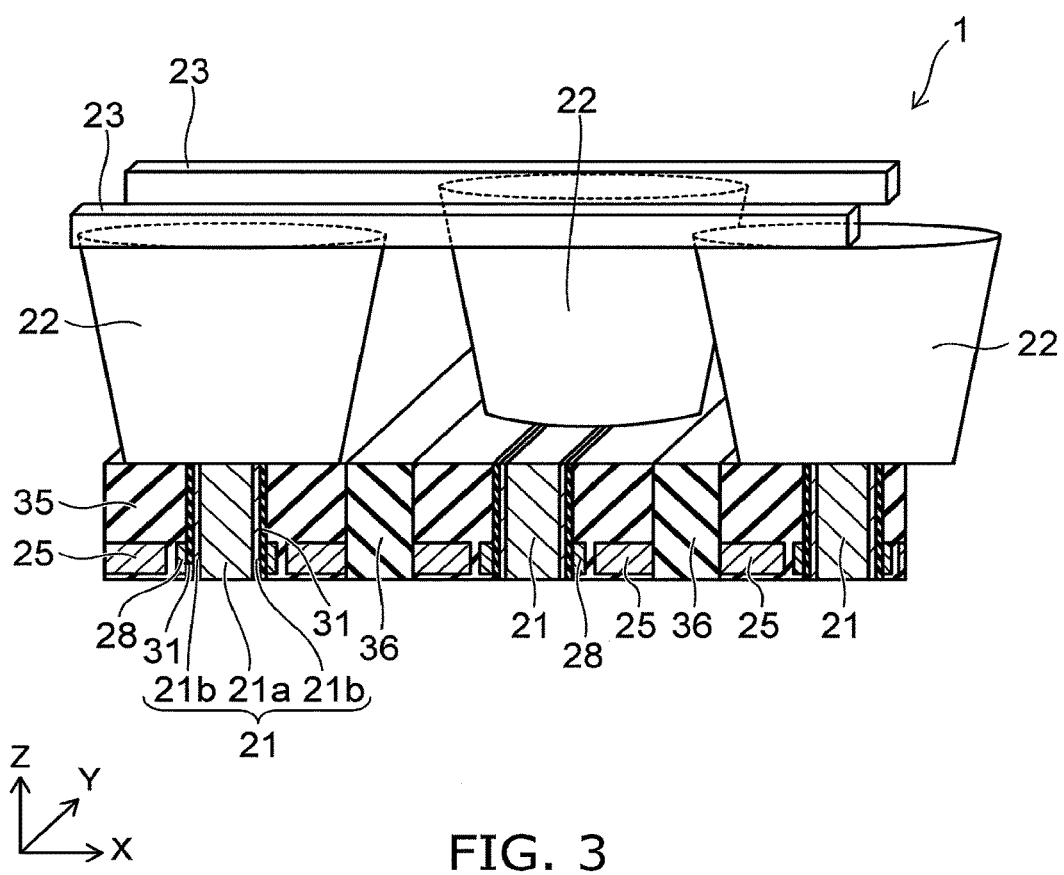
FIG. 3 is a perspective view showing a contact periphery of the semiconductor memory device according to the first embodiment.

FIG. 3 is a perspective view showing the contact periphery of the semiconductor memory device according to the embodiment.

First, a schematic configuration of the semiconductor memory device 1 according to the embodiment will be described.

As shown in FIG. 1A, FIG. 1B, and FIG. 3, a silicon substrate 10 is provided in the semiconductor memory device 1. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction." Multiple silicon pillars 21 are provided on the silicon substrate 10. The silicon pillars 21 are arranged in a matrix configuration along the X-direction and the Y-direction. The configuration of each of the silicon pillars 21 is a quadrilateral column extending in the Z-direction. The lower end of the silicon pillar 21 is connected to the silicon substrate 10. The silicon pillar 21 may be finer downward, that is, toward the silicon substrate 10.

A contact 22 is provided on the silicon pillar 21. The contact 22 is made of a metal such as, for example, tungsten (W), etc. The configuration of the contact 22 is, for example, an inverted truncated oval cone. In other words, the central axis of the contact 22 extends in the Z-direction; and when viewed from the Z-direction, the configuration of the contact 22 is an oval having the X-direction as the major-diameter direction and the Y-direction as the minor-diameter direction. Also, the major diameter and the minor diameter of the contact 22 decrease downward. An upper surface 22b and a lower surface 22a of the contact 22 each are ovals; the surface area of the lower surface 22a is less than the surface area of the upper surface 22b; and, for example, the upper surface 22b and the lower surface 22a have similar shapes. A portion of the lower surface 22a of the contact 22 contacts a portion of the upper surface of the silicon pillar 21; thereby, the contact 22 is connected to the silicon pillar 21.

The major diameter, i.e., the length in the X-direction, of the lower surface 22a of the contact 22 is longer than the length in the X-direction of the upper surface of the silicon pillar 21. Accordingly, in the X-direction, the lower surface of the contact 22 juts to the two X-direction sides from the upper surface of the silicon pillar 21. On the other hand, the minor diameter, i.e., the length in the Y-direction, of the lower surface 22a of the contact 22 is shorter than the length in the Y-direction of the upper surface of the silicon pillar 21. Accordingly, in the Y-direction, the lower surface 22a of the contact 22 contacts only a portion of the upper surface of the silicon pillar 21. The lower surface 22a of the contact 22 contacts a region on one Y-direction side of the upper surface of the silicon pillar 21 and contacts, for example, a region including an end edge extending in the X-direction. Also, along the X-direction, the contacts 22 are arranged alternately on the end portion on one Y-direction side of the silicon pillar 21 and on the end portion on the other Y-direction side of the silicon pillar 21.

Multiple bit lines 23 that extend in the X-direction are provided on the contacts 22. The bit lines 23 are formed of, for example, a metal such as tungsten, etc. The width, i.e., the length in the Y-direction, of the bit line 23 is about the same as the minor diameter, i.e., the length in the Y-direction, of the upper surface 22b of the contact 22. The upper surface 22b of the contact 22 contacts the lower surface of the bit line 23; thereby, the contact 22 is connected to the bit line 23.

Also, two bit lines 23 are provided for each column of the silicon pillars 21 arranged along the X-direction. Two mutually-adjacent bit lines 23 pass through the regions directly above the two Y-direction end portions of the silicon pillars 21 arranged in one column along the X-direction. Also, each of the silicon pillars 21 is connected to one bit line 23 via one contact 22. Thereby, the two silicon pillars 21 that are adjacent to each other in the X-direction are connected to mutually-different bit lines 23. In other words, the two contacts 22 that are connected to two mutually-adjacent bit lines 23 are disposed at positions different from each other in both the X-direction and the Y-direction. The form of such an arrangement of the contacts 22 is called "two-consecutive staggered."

Because FIG. 1A and FIG. 1B are drawings showing the general concept of the device, several conductive members are mainly drawn schematically; and the other portions are drawn as being simplified. Also, in FIG. 1A, the bit lines 23 are shown by double dot-dash lines for easier viewing of the drawing. Further, the silicon pillars 21 are shown in gray in FIG. 1A. This is similar for FIG. 15A and FIG. 17A described below as well.

Also, multiple word lines 25 that extend in the Y-direction are provided on the silicon substrate 10. As described below, the word lines 25 are formed of a metal such as tungsten, etc. The word lines 25 are arranged in one column along the Z-direction on the two X-direction sides of the silicon pillars 21 arranged in one column along the Y-direction. Also, one unit includes the multiple silicon pillars 21 arranged in one column along the Y-direction and the multiple word lines 25 arranged in one column along the Z-direction on each of the two X-direction sides of the multiple silicon pillars 21. In other words, one silicon pillar 21 and two word lines 25 are arranged alternately along the X-direction. One source electrode 26 is provided every several units. The configuration of the source electrode 26 is a sheet configuration spreading along the YZ plane and is disposed between two mutually-adjacent units. The lower end of the source electrode 26 is connected to the silicon substrate 10.

A floating gate electrode 28 is provided between each of the silicon pillars 21 and each of the word lines 25. The configuration of the floating gate electrode 28 is a rod configuration extending in the Y-direction. The floating gate electrode 28 is insulated from the periphery, is a conductive member that stores charge, and is formed of, for example, polysilicon (Si).

As described below, an insulating material is filled between the silicon pillars 21, the word lines 25, the source electrode 26, the floating gate electrodes 28, and the bit lines 23.

The configuration of the periphery of the crossing portion between each of the silicon pillars 21 and each of the word lines 25 of the semiconductor memory device 1 will now be described in detail.

As shown in FIG. 2A and FIG. 2B, a tunneling insulating film 31 is provided at the periphery of the silicon pillar 21. The tunneling insulating film 31 is a film in which a tunneling current flows when a prescribed voltage within the range of the drive voltage of the semiconductor memory device 1 is applied and is, for example, a single-layer silicon oxide film, or a three-layer film made of a silicon oxide layer, a silicon nitride layer, and a silicon oxide layer. The configuration of the tunneling insulating film 31 is a pipe-like configuration extending in the Z-direction along the side surface of the silicon pillar 21. A portion of the tunneling insulating film 31 is disposed between the silicon pillar 21 and the floating gate electrode 28.

A main portion 25a that is made of, for example, tungsten and a barrier metal layer 25b that is made of, for example, titanium nitride (TiN) are provided in the word line 25. The configuration of the main portion 25a is a band configuration extending in the Y-direction. The barrier metal layer 25b covers the side surface of the main portion 25a on the floating gate electrode 28 side, the upper surface of the main portion 25a, and the lower surface of the main portion 25a.

Also, a blocking insulating film 32 is provided on the side surface of the word line 25 on the floating gate electrode 28 side, on the upper surface of the word line 25, and on the lower surface of the word line 25. The configuration of the blocking insulating film 32 in the XZ cross section is a C-shaped configuration surrounding the word line 25. The blocking insulating film 32 is a film in which a current substantially does not flow even when a voltage within the range of the drive voltage of the semiconductor memory device 1 is applied and is, for example, a high dielectric constant film in which the dielectric constant of the entirety is higher than the dielectric constant of silicon oxide. For example, the dielectric constant of the blocking insulating film 32 is higher than the dielectric constant of the tunneling insulating film 31. A hafnium oxide layer 32a that is made of hafnium oxide ($HfO_2$), a silicon oxide layer 32b that is made of silicon oxide ($SiO_2$), and a hafnium silicon oxide layer 32c that is made of hafnium silicon oxide (HfSiO) are stacked in the blocking insulating film 32 in order from the word line 25 side.

A body portion 21a that includes the central axis and a cover layer 21b that covers the side surface of the body portion 21a are provided in the silicon pillar 21. The body portion 21a and the cover layer 21b contact each other. The lower end of the body portion 21a contacts the silicon substrate 10; and the lower end of the cover layer 21b does not contact the silicon substrate 10. An impurity diffusion layer 10a is formed in the portion of the silicon substrate 10 contacting the body portion 21a. Also, an impurity diffusion layer 10b is formed in the portion of the silicon substrate 10 contacting the source electrode 26.

An inter-layer insulating film 35 that is made of, for example, silicon oxide and has a band configuration extending in the Y-direction is provided between the blocking insulating films 32 adjacent to each other in the Z-direction.

Also, an insulating member 36 that is made of, for example, silicon oxide and has a sheet configuration spreading along the YZ plane is provided in the space where the silicon pillar 21 is not provided between the word lines 25 adjacent to each other in the X-direction, between the blocking insulating films 32 adjacent to each other in the X-direction, and between the inter-layer insulating films 35 adjacent to each other in the X-direction. The spacing of the insulating members 36 adjacent to each other in the X-direction is longer than the length in the X-direction of the lower surface 22a of the contact 22 connected to the silicon pillar 21 interposed between these insulating members 36. Further, an insulating member 37 that is made of, for example, silicon oxide is provided between the tunneling insulating films 31 adjacent to each other in the Y-direction.

In the semiconductor memory device 1, a transistor that includes one floating gate electrode 28 is formed at each crossing portion between the silicon pillars 21 and the word lines 25 and functions as a memory cell. Also, a NAND string in which the multiple memory cells are connected in series is connected between the bit line 23 and the silicon substrate 10.

A method for manufacturing the semiconductor memory device according to the embodiment will now be described.

FIG. 4A to FIG. 7B are cross-sectional views showing the method for manufacturing the semiconductor memory device according to the embodiment.

Figure 4A:
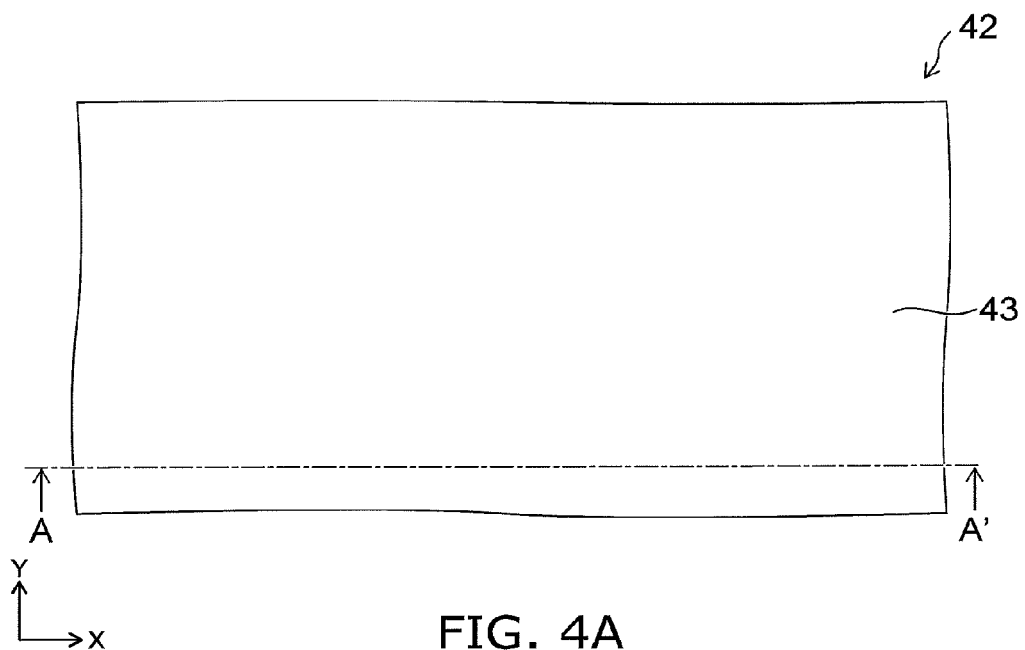
FIG. 4A to FIG. 7B are cross-sectional views showing a method for manufacturing the semiconductor memory device according to the first embodiment.
Figure 4B:
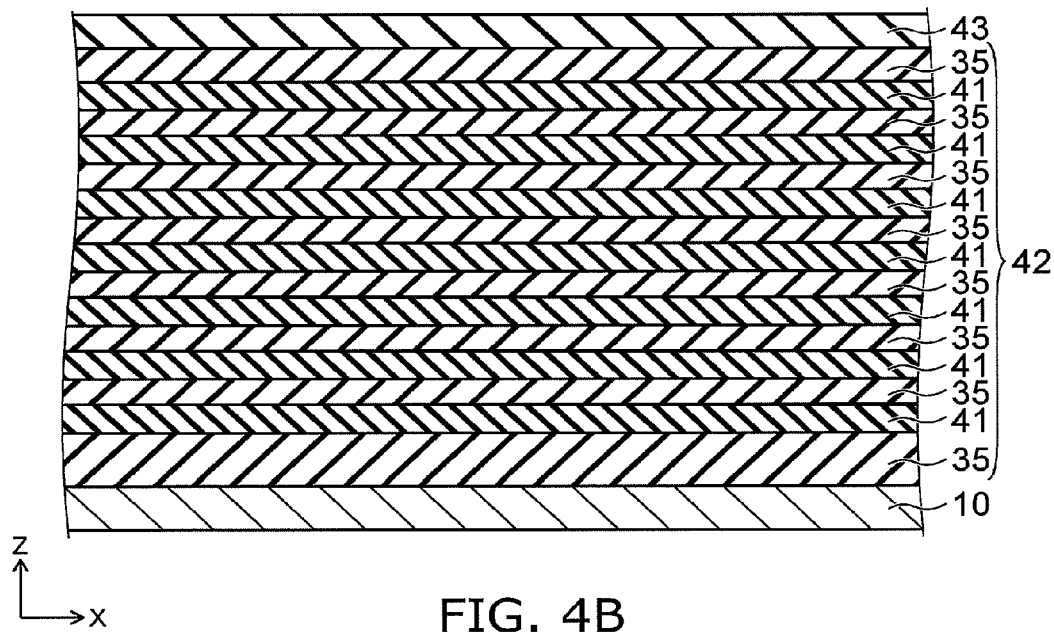

FIG. 4B is a cross-sectional view along line A-A' shown in FIG. 4A. The other drawings also are similar.

FIG. 8 to FIG. 14 are cross-sectional views showing the method for manufacturing the semiconductor memory device according to the embodiment.

First, the silicon substrate 10 is prepared as shown in FIG. 4A and FIG. 4B.

Then, a stacked body 42 is formed by stacking the inter-layer insulating films 35 made of, for example, silicon oxide and sacrificial films 41 made of, for example, silicon nitride alternately on the silicon substrate 10. An etching stopper film 43 that is made of, for example, silicon nitride or polysilicon is formed on the stacked body 42.

Figure 5A:
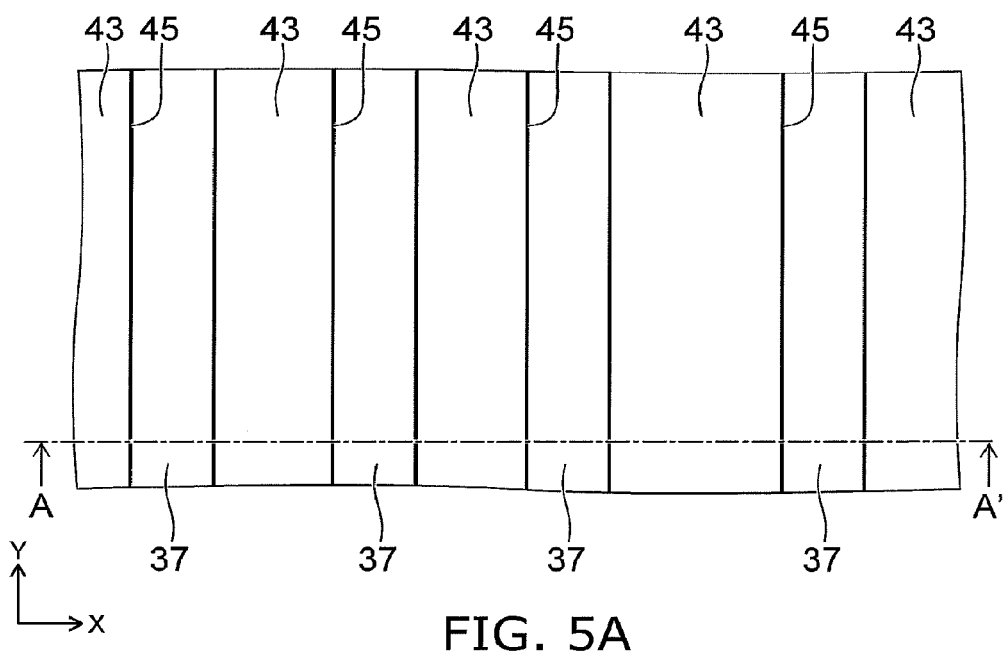
Figure 5B:
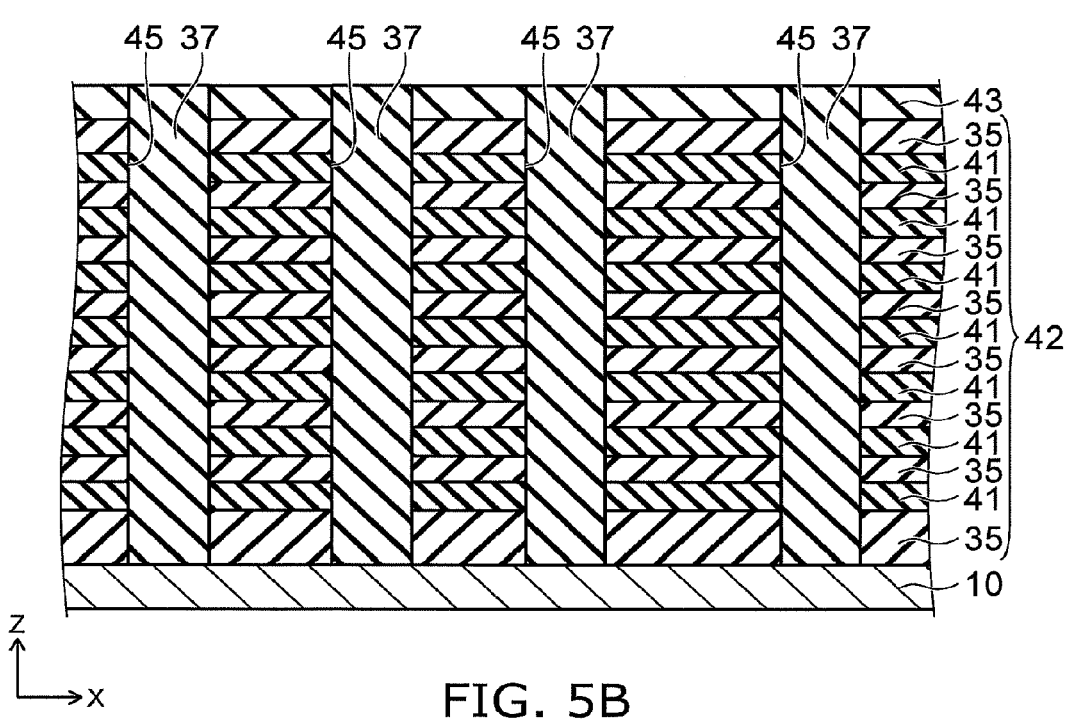

Then, as shown in FIG. 5A and FIG. 5B, memory trenches 45 that extend in the Y-direction are multiply formed in the etching stopper film 43 and the stacked body 42. The memory trenches 45 pierce the etching stopper film 43 and the stacked body 42; and the silicon substrate 10 is exposed at the bottom surfaces of the memory trenches 45. Then, the insulating member 37 that is made of, for example, silicon oxide is filled into the memory trenches 45.

Figure 6A:
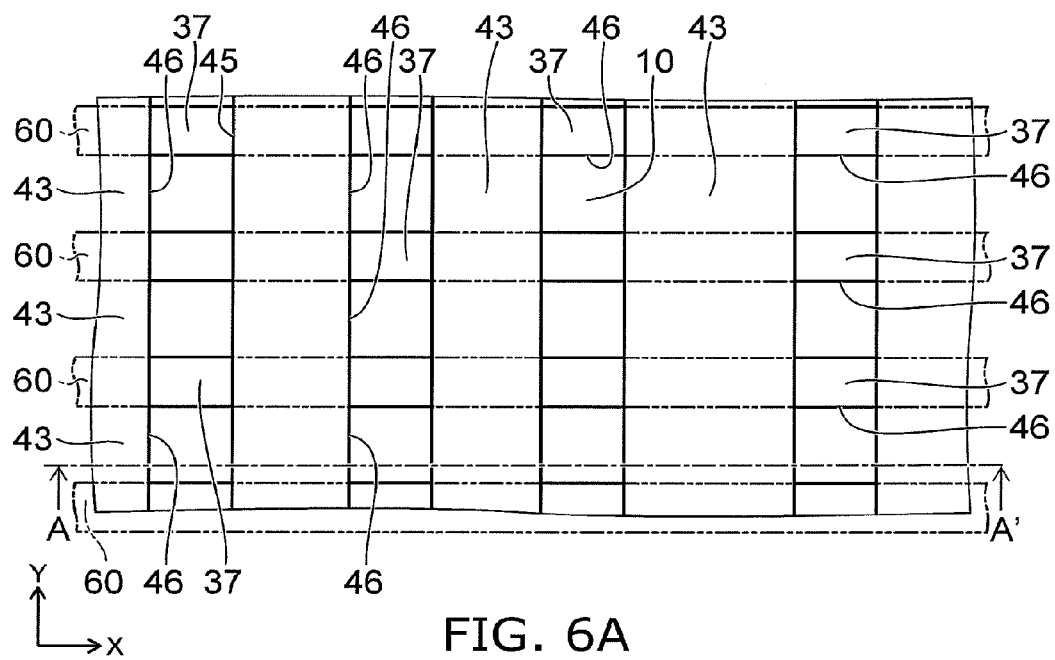
Figure 6B:
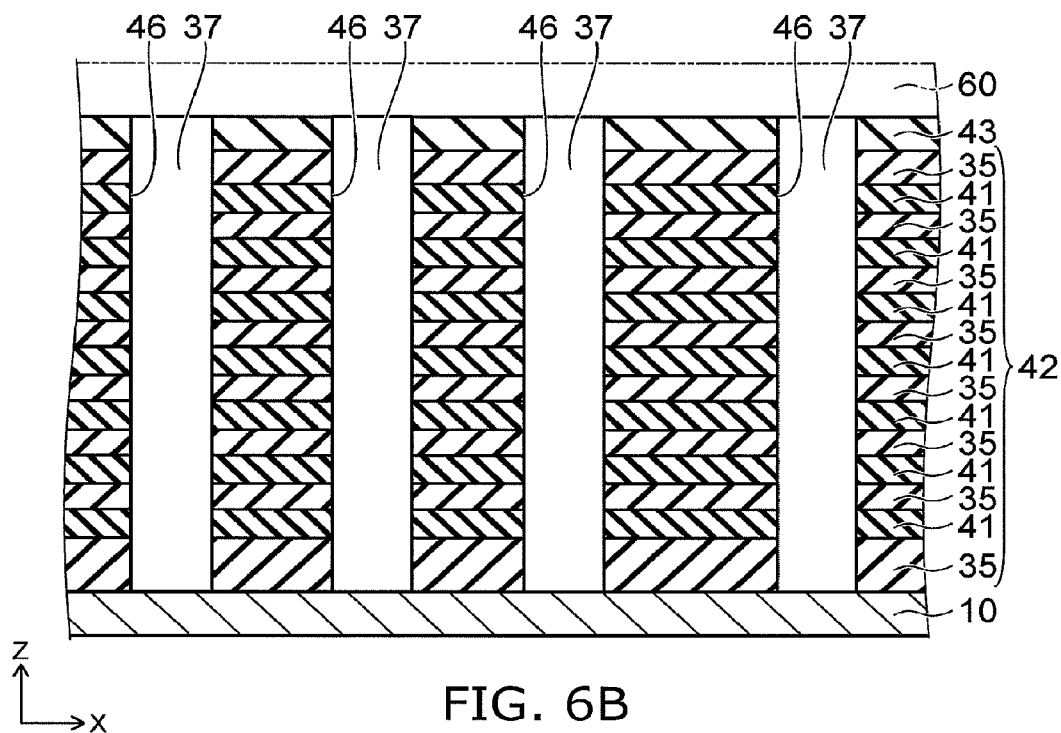

Then, as shown in FIG. 6A and FIG. 6B, a mask 60, in which patterns having line-and-space configurations extending in the X-direction are arranged along the Y-direction, is formed on the etching stopper film 43. Then, the insulating member 37 is selectively removed by performing anisotropic etching such as RIE (Reactive Ion Etching), etc., using the mask 60 and the etching stopper film 43 as a mask. Thereby, memory holes 46 are formed inside the memory trenches 45. The silicon substrate 10 is exposed at the bottom surfaces of the memory holes 46. Then, the mask 60 and the etching stopper film 43 are removed.

Figure 7A:
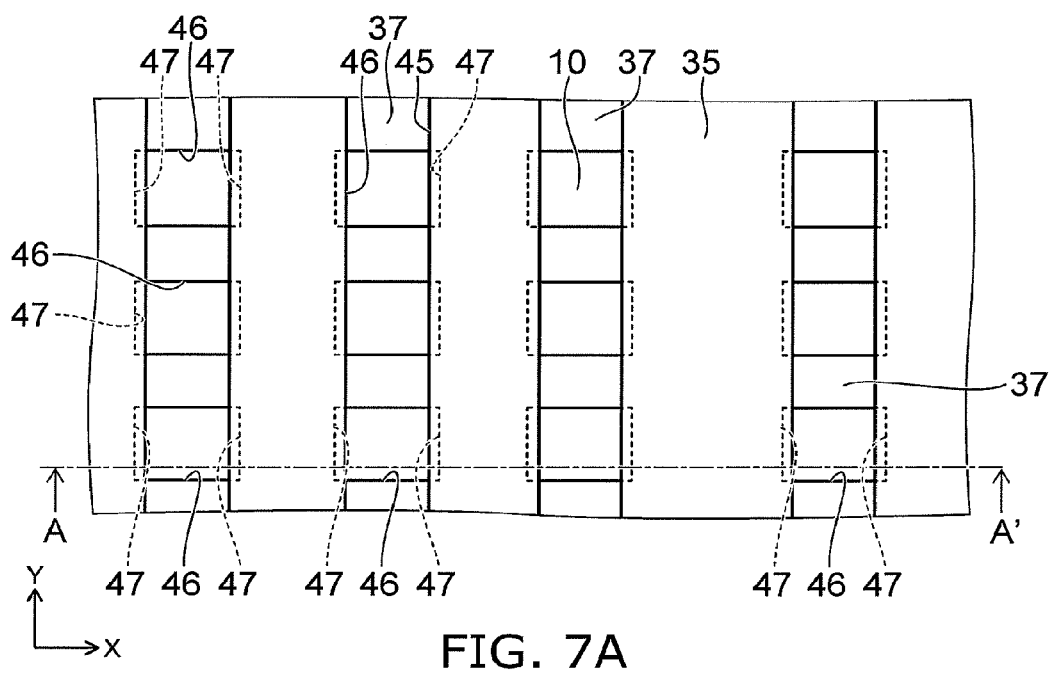
Figure 7B:
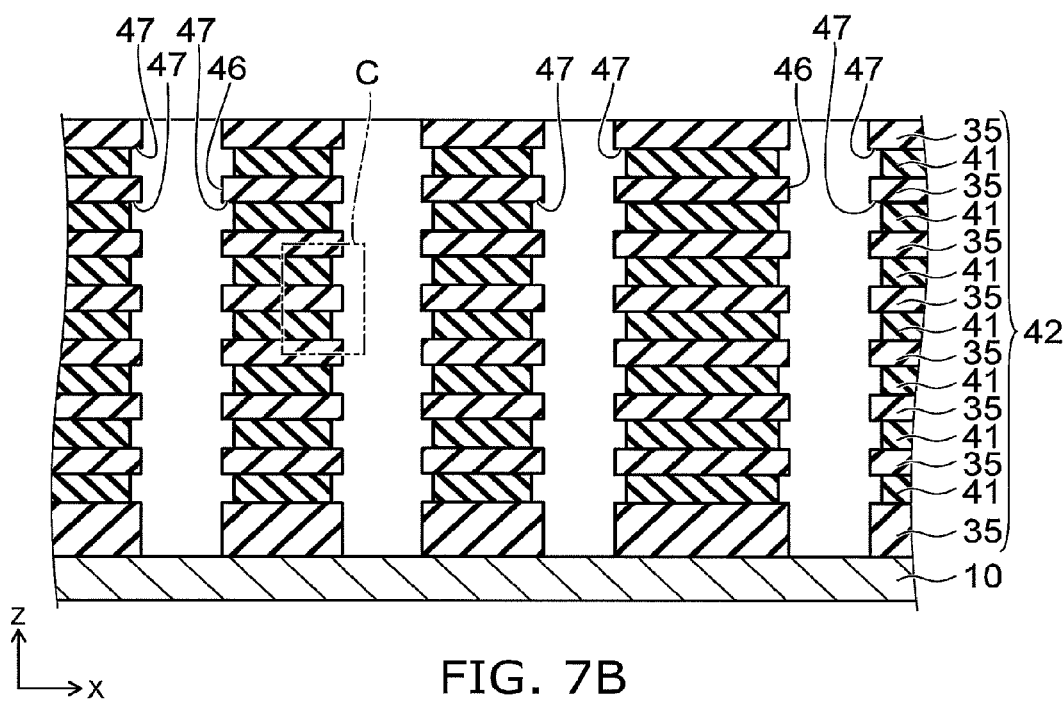

Then, as shown in FIG. 7A and FIG. 7B, isotropic etching of the sacrificial films 41 is performed via the memory holes 46. For example, wet etching using hot phosphoric acid as the etchant is performed. Thereby, the portion of the sacrificial films 41 exposed at the side surface of the memory hole 46 is removed. As a result, recesses 47 are formed in the side surfaces of the memory holes 46 facing the X-direction.

FIG. 8 to FIG. 14 described below show a region corresponding to region C of FIG. 7B.

Figure 8:
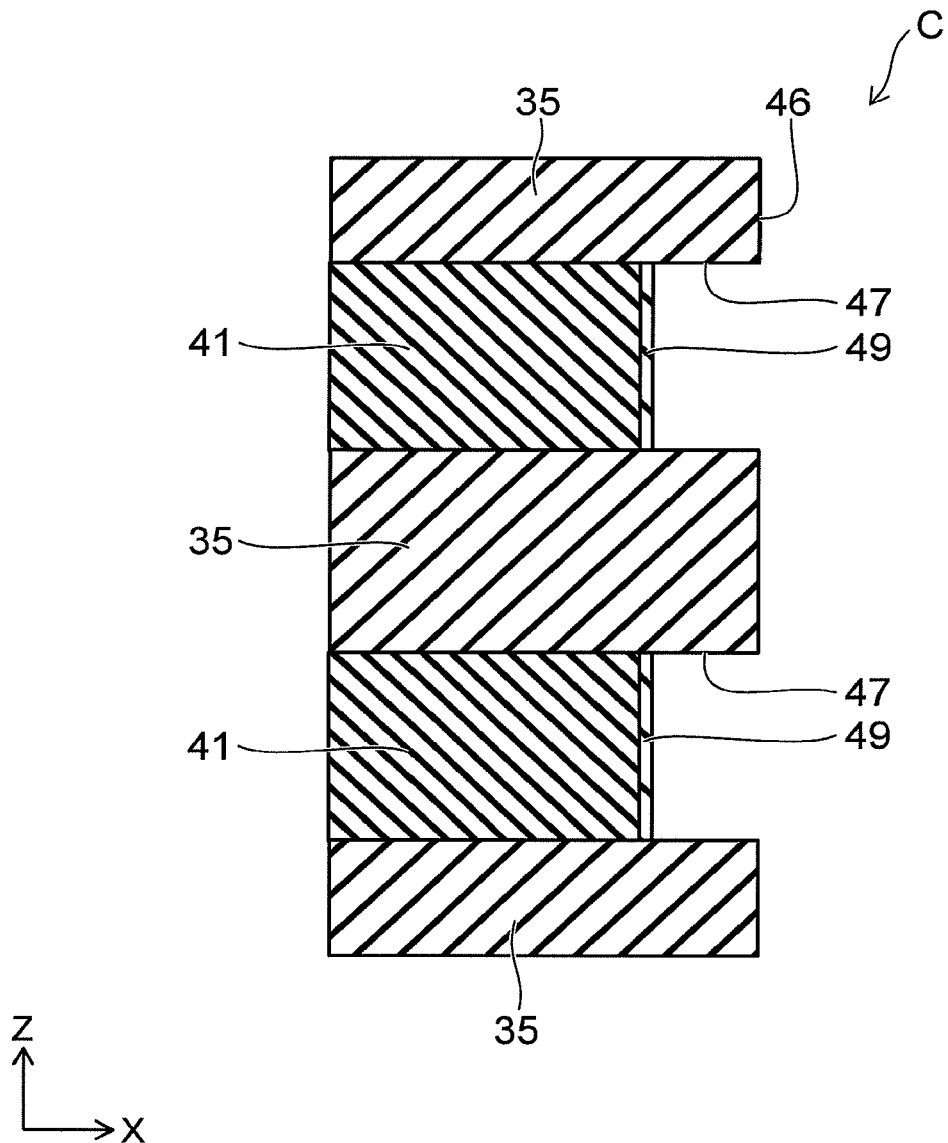
FIG. 8 to FIG. 14 are a cross-sectional view showing the method for manufacturing the semiconductor memory device according to the first embodiment.

Then, as shown in FIG. 8, a stopper layer 49 that is made of silicon oxide is formed on the exposed surfaces of the sacrificial films 41 inside the recesses 47 by, for example, performing thermal oxidation treatment. The stopper layer 49 may be formed by depositing silicon oxide using CVD (chemical vapor deposition), etc.

Figure 9:
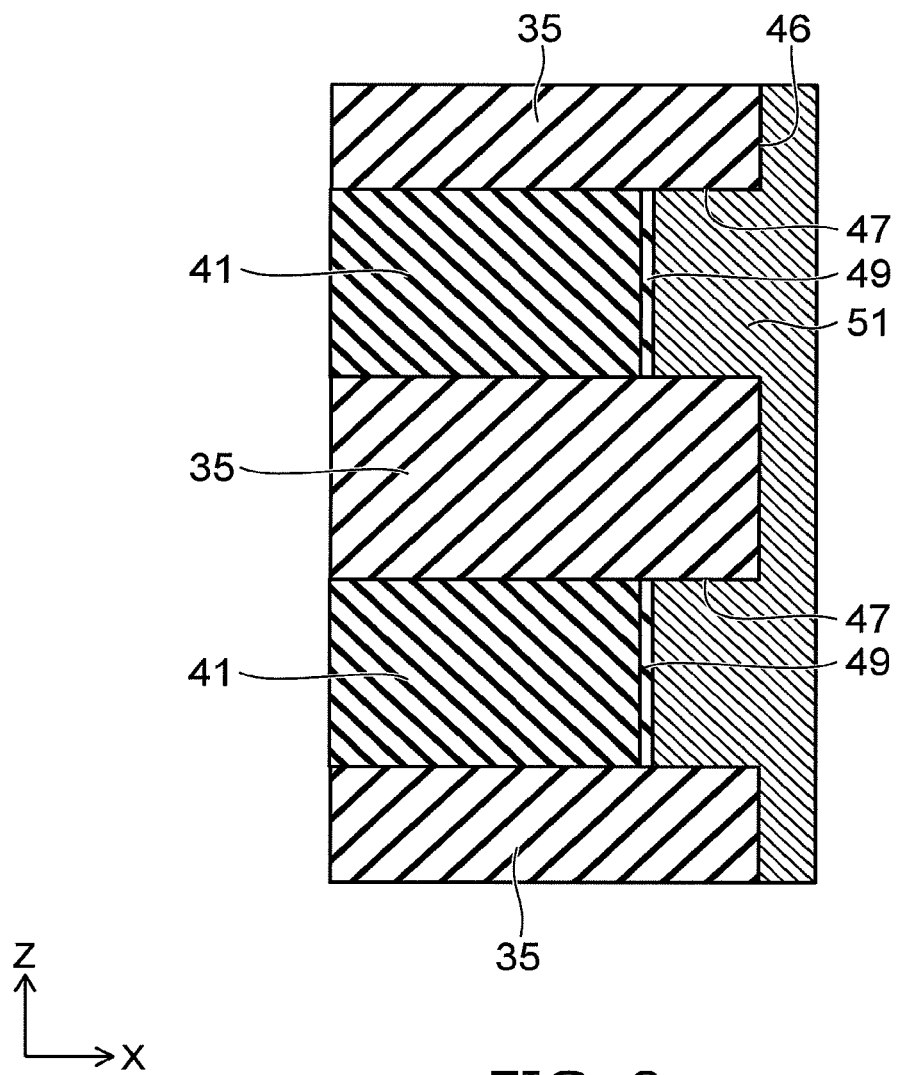

Then, as shown in FIG. 9, a silicon film 51 is formed on the inner surface of the memory hole 46 by depositing amorphous silicon using, for example, CVD, etc. The silicon film 51 is filled also into the recesses 47.

Figure 10:
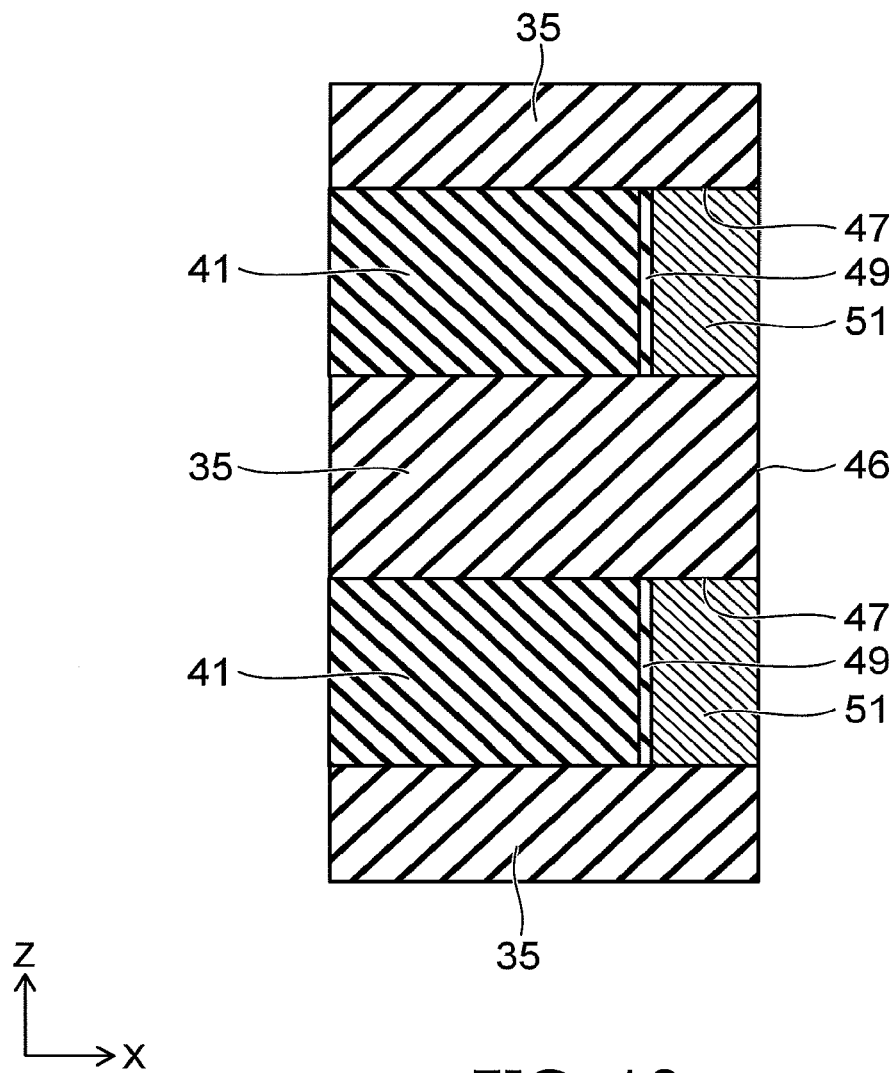

Then, as shown in FIG. 10, etch-back of the silicon film 51 is performed to cause the portion of the silicon film 51 disposed inside the recesses 47 to remain and to remove the portion of the silicon film 51 disposed outside the recesses 47. Thereby, the silicon film 51 is divided every sacrificial film 41 in the Z-direction.

Figure 11:
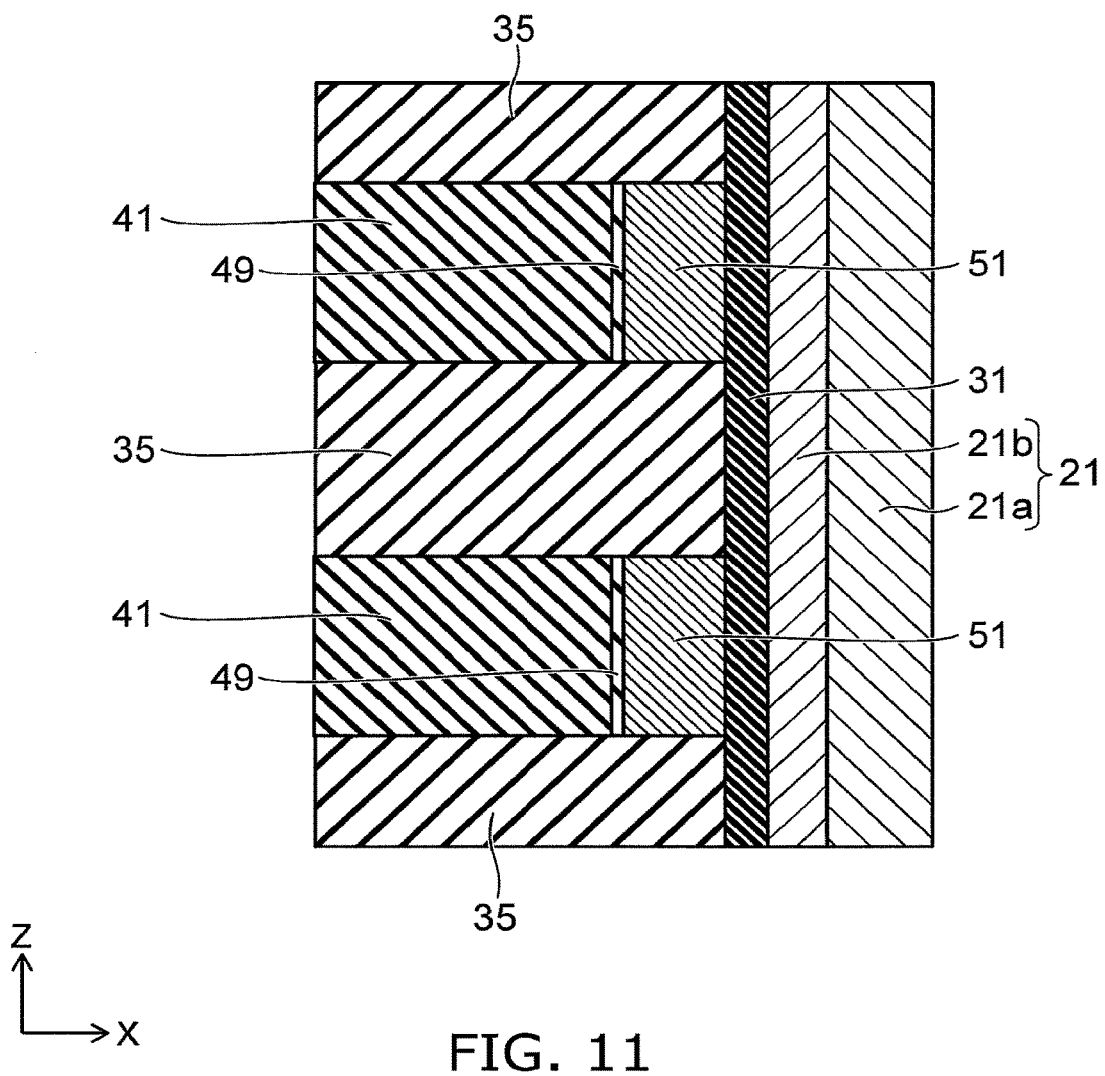

Then, as shown in FIG. 11, the tunneling insulating film 31 is formed on the inner surface of the memory hole 46 by depositing silicon oxide using, for example, CVD, etc. Then, the cover layer 21b is formed on the tunneling insulating film 31 by depositing amorphous silicon using CVD, etc. At this time, the cover layer 21b does not fill the entire memory hole 46.

Then, anisotropic etching such as RIE or the like of the cover layer 21b and the tunneling insulating film 31 is performed. Thereby, the cover layer 21b and the tunneling insulating film 31 that are on the bottom surface of the memory hole 46 are removed; and the silicon substrate 10 is exposed. At this time, the portion of the tunneling insulating film 31 disposed on the side surface of the memory hole 46 is not easily damaged by the anisotropic etching because the portion of the tunneling insulating film 31 is protected by the cover layer 21b. Then, ion implantation of an impurity such as arsenic (As), phosphorus (P), or the like is performed on the entire surface. Thereby, the impurity diffusion layer 10a is formed in the portion of the silicon substrate 10 where the opening is made in the bottom surface of the memory hole 46.

Then, the body portion 21a is filled into the memory hole 46 by depositing amorphous silicon using CVD, etc. The lower end of the body portion 21a contacts the impurity diffusion layer 10a of the silicon substrate 10. The silicon pillar 21 is formed of the cover layer 21b and the body portion 21a.

Figure 12:
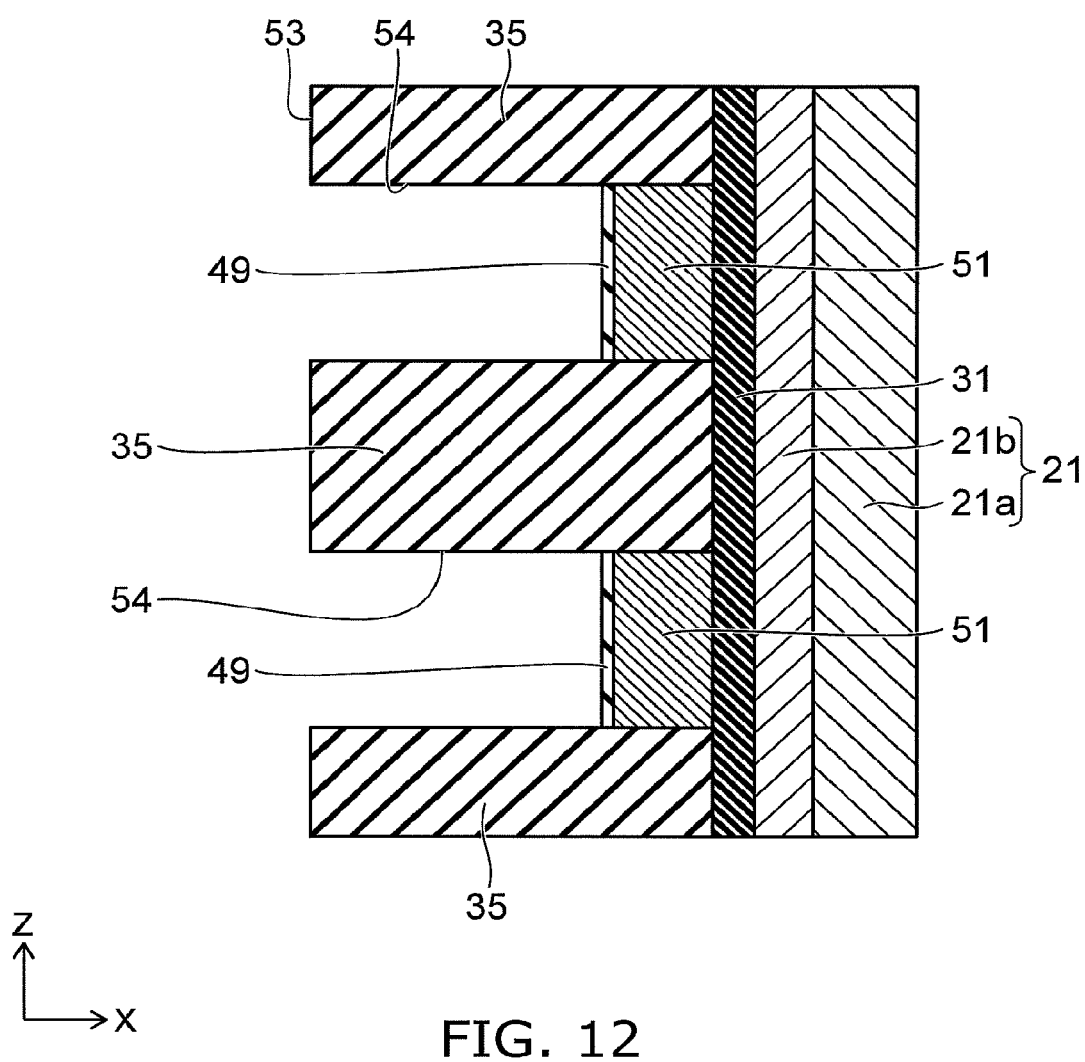

Then, as shown in FIG. 12, a slit 53 that extends in the Y-direction is formed in the portion of the stacked body 42 between the memory trenches 45 by performing, for example, RIE. The slit 53 pierces the stacked body 42. Then, isotropic etching of the sacrificial films 41 (referring to FIG. 11) is performed via the slit 53 using the stopper layer 49 as a stopper. For example, wet etching using hot phosphoric acid as the etchant is performed. Thereby, the sacrificial films 41 are removed; and recesses 54 that extend in the Y-direction are formed in the side surface of the slit 53. The stopper layer 49 is exposed at the back surfaces of the recesses 54.

Figure 13:
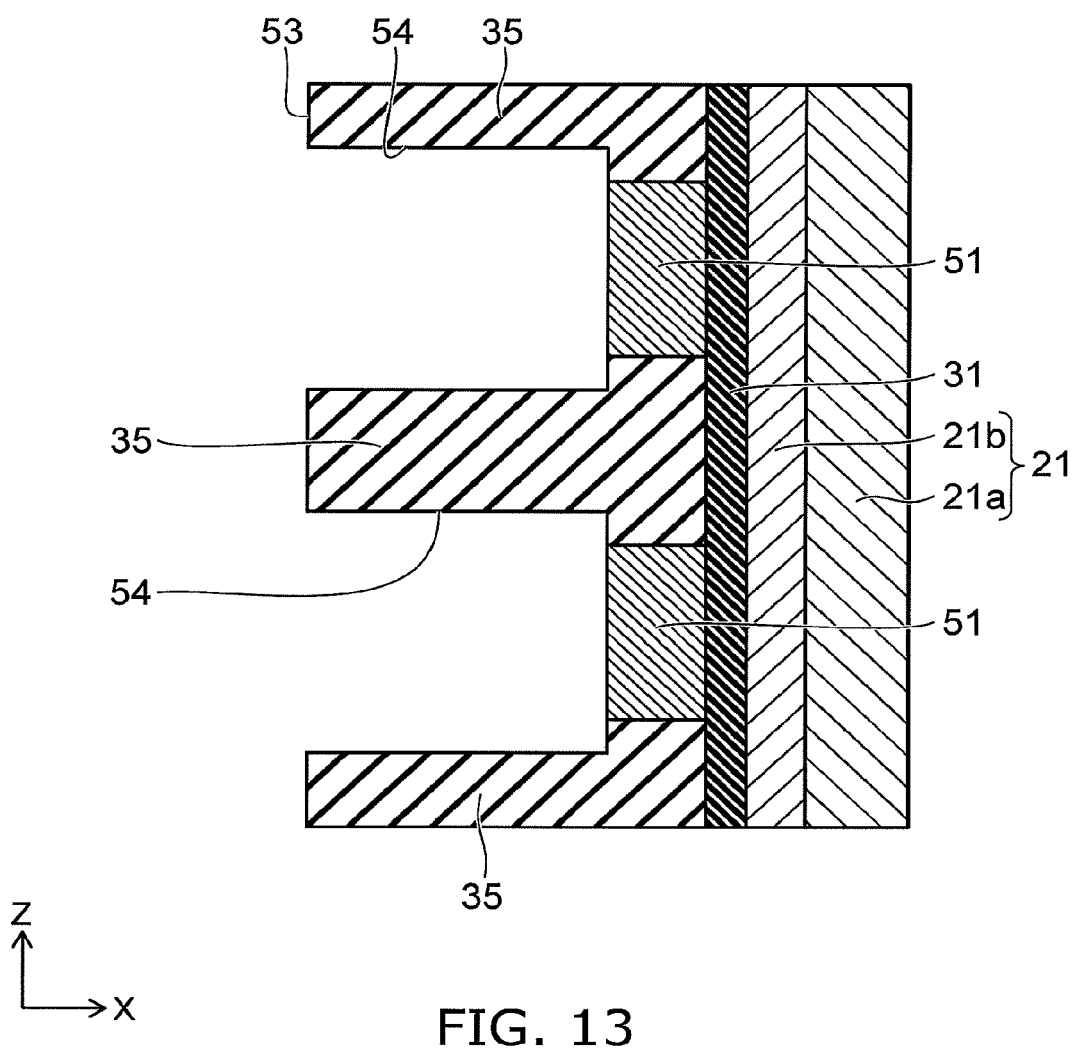

Then, as shown in FIG. 13, the stopper layer 49 that is made of silicon oxide and is on the back surfaces of the recesses 54 (referring to FIG. 12) is removed by performing, for example, wet etching using DHF (diluted hydrofluoric acid) as the etchant via the slit 53 and the recesses 54. Thereby, the silicon film 51 is exposed at the back surfaces of the recesses 54. At this time, a portion of the inter-layer insulating films 35 made of silicon oxide also is removed; and the lengths in the Z-direction of the recesses 54 are enlarged.

Figure 14:
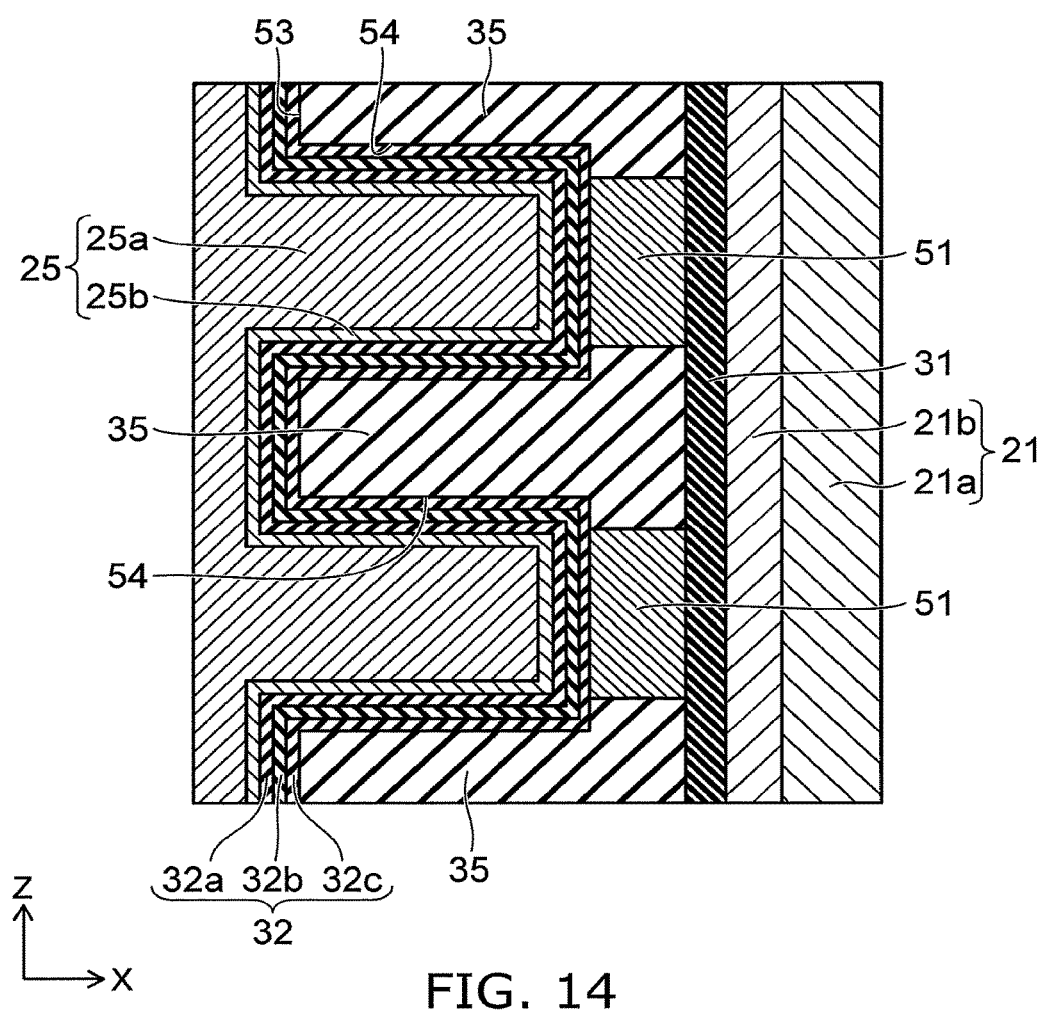

Then, as shown in FIG. 14, via the slit 53 and the recesses 54, the hafnium silicon oxide layer 32c is formed by depositing hafnium silicon oxide (HfSiO); the silicon oxide layer 32b is formed by depositing silicon oxide (SiO$_2$); and the hafnium oxide layer 32a is formed by depositing hafnium oxide (HfO$_2$). Thereby, the blocking insulating film 32 is formed in the slit 53 and on the inner surfaces of the recesses 54. At this time, the blocking insulating film 32 does not fill the entire interior of the recess 54.

Then, titanium nitride (TiN) is deposited by, for example, CVD via the slit 53 and the recesses 54. Thereby, the barrier metal layer 25b is formed on the side surface of the blocking insulating film 32. Then, tungsten is deposited by, for example, CVD inside the slit 53 and the recesses 54. Thereby, the main portion 25a is formed on the side surface of the barrier metal layer 25b. The main portion 25a fills the entire interior of the recess 54. Thus, the word line 25 that is made of the barrier metal layer 25b and the main portion 25a is formed inside the slit 53 and inside the recesses 54.

Then, as shown in FIG. 2A and FIG. 2B, etch-back of the word line 25 is performed via the slit 53. Thereby, the portion of the word line 25 disposed inside the recesses 54 is caused to remain; and the portion of the word line 25 disposed outside the recesses 54 is removed. Then, etch-back of the blocking insulating film 32 is performed via the slit 53. Thereby, the portion of the blocking insulating film 32 disposed inside the recesses 54 is caused to remain; and the portion of the blocking insulating film 32 disposed outside the recesses 54 is removed. Thereby, the blocking insulating film 32 also is divided every recess 54. Then, the insulating member 36 is filled into the slit 53 by depositing silicon oxide.

Then, as shown in FIG. 1A and FIG. 1B, a slit that extends in the Y-direction and reaches the silicon substrate 10 is formed inside a portion of the insulating members 36. Then, the impurity diffusion layer 10b is formed in the portion of the silicon substrate 10 exposed at the bottom surface of the slit by ion-implanting an impurity such as arsenic, phosphorus, etc., into the entire surface. Then, the source electrode 26 is formed by filling, for example, a conductive material such as tungsten, etc., into the slit. The source electrode 26 contacts the impurity diffusion layer 10b of the silicon substrate 10.

Thus, a stacked structure body 70 is formed on the silicon substrate 10. The multiple silicon pillars 21 that extend in the Z-direction are arranged in a matrix configuration along the X-direction and the Y-direction inside the stacked structure body 70; the multiple word lines 25 that extend in the Y-direction are arranged in a matrix configuration along the X-direction and the Z-direction between the silicon pillars 21; and the floating gate electrodes 28 are disposed between the silicon pillars 21 and the word lines 25. Also, the source electrode 26 that spreads along the YZ plane and has its lower end connected to the silicon substrate 10 is disposed inside the stacked structure body 70. The upper surfaces of the silicon pillars 21 are exposed at the upper surface of the stacked structure body 70.

Then, an inter-layer insulating film 71 is formed on the stacked structure body 70; and contact holes 72 are formed in the inter-layer insulating film 71. The contact holes 72 are formed at each silicon pillar 21 and are arranged in a staggered configuration as an entirety. In other words, the multiple contact holes 72 arranged in one column along the Y-direction are formed in the region directly above one Y-direction end portion for each of the multiple silicon pillars 21 arranged in one column along the Y-direction. Also, the contact holes 72 belonging to the adjacent column when viewed from the column of the contact holes 72 are formed in the region directly above the other Y-direction end portion for each of the silicon pillars 21. Then, for example, the contacts 22 are formed inside the contact holes 72 by forming a barrier metal layer made of titanium nitride (not illustrated) on the inner surfaces of the contact holes 72 and by filling a metal material such as tungsten, etc., into the contact holes 72. The lower surfaces of the contacts 22 respectively contact the upper surfaces of the silicon pillars 21; and each of the contacts 22 is connected to the silicon pillar 21.

Then, the multiple bit lines 23 that extend in the X-direction are formed on the inter-layer insulating film 71 and the contacts 22. At this time, two mutually-adjacent bit lines 23 respectively pass through the regions directly above the two Y-direction end portions for each of the silicon pillars 21. Thereby, each of the bit lines 23 is connected to the contacts 22 arranged in one column along the X-direction. As a result, each of the bit lines 23 is connected via the contacts 22 to every other silicon pillar 21 arranged along the X-direction. Thereafter, the semiconductor memory device 1 according to the embodiment is manufactured using normal processes.

Effects of the embodiment will now be described.

According to the embodiment, the arrangement period of the silicon pillars 21 in the Y-direction can be set to be 2 times the arrangement period of the bit lines 23. Therefore, the process conditions of the patterning having the high aspect ratio for forming the silicon pillars 21 can be relaxed. Specifically, the arrangement period of the lines-and-spaces of the mask 60 can be set to be 2 times the arrangement period of the bit lines 23 in the process shown in FIG. 6; and the formation of the mask 60 and the anisotropic etching using the mask 60 as a mask are easier.

Also, in the embodiment, because the contacts 22 are arranged in a staggered configuration, the distance between the contacts 22 can be set to be long compared to the case where the contacts 22 are arranged in a matrix configuration along the X-direction and the Y-direction. Thereby, the formation of the contacts 22 is easier; and shorts between the contacts 22 can be suppressed.

Further, in the embodiment, the spacing of the insulating members 36 adjacent to each other in the X-direction is set to be longer than the length in the X-direction of the lower surface 22a of the contact 22 connected to the silicon pillar 21 interposed between the insulating members 36. Thereby, the contact with the source electrode 26 of the contacts 22 disposed at the vicinity of the source electrode 26 can be suppressed.

Further, in the semiconductor memory device 1 according to the embodiment, the multiple memory cells that share one word line 25 are set to be one page; and the program operation or read operation of data is performed by page unit. Therefore, when applying a prescribed potential to the bit line 23 connected to the selected memory cell, a fixed potential is applied to the two bit lines 23 adjacent to that bit line 23. Thereby, the bit line 23 to which the prescribed potential is applied can be electromagnetically shielded by being interposed between the bit lines 23 to which the fixed potential is applied. As a result, the occurrence of noise due to the potential change of the selected bit line 23 can be suppressed; and the effect of the external electric field change on the selected bit line 23 can be reduced. Therefore, the operation of the semiconductor memory device 1 is stable.

Second Embodiment

A second embodiment will now be described.

Figure 15A:
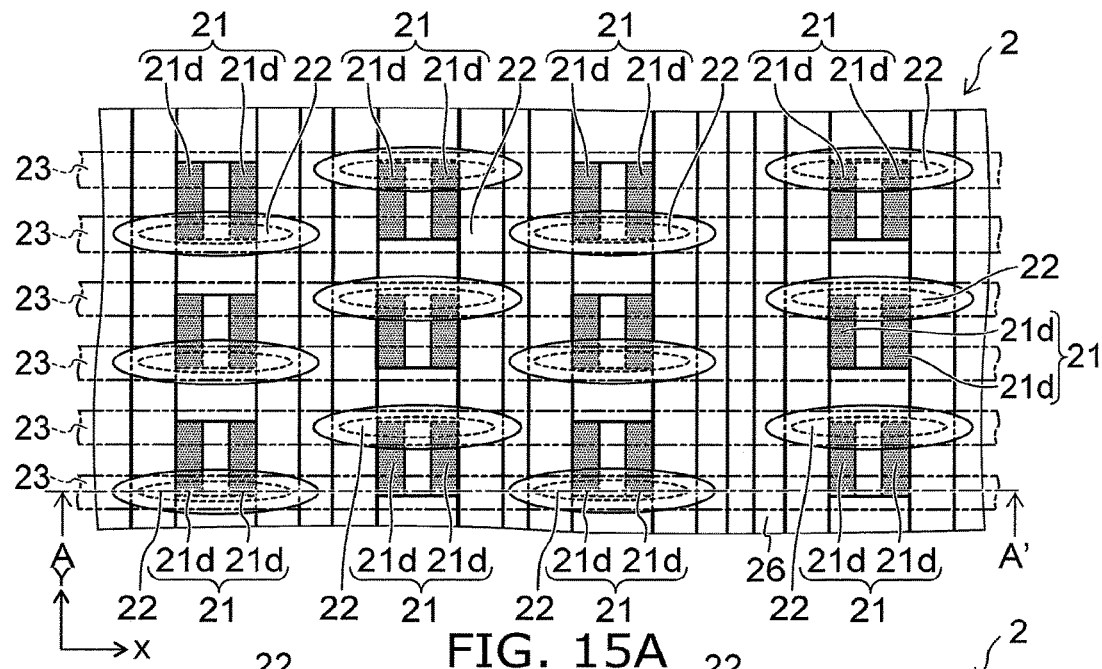
FIG. 15A is a plan view showing a semiconductor memory device according to a second embodiment.
Figure 15B:
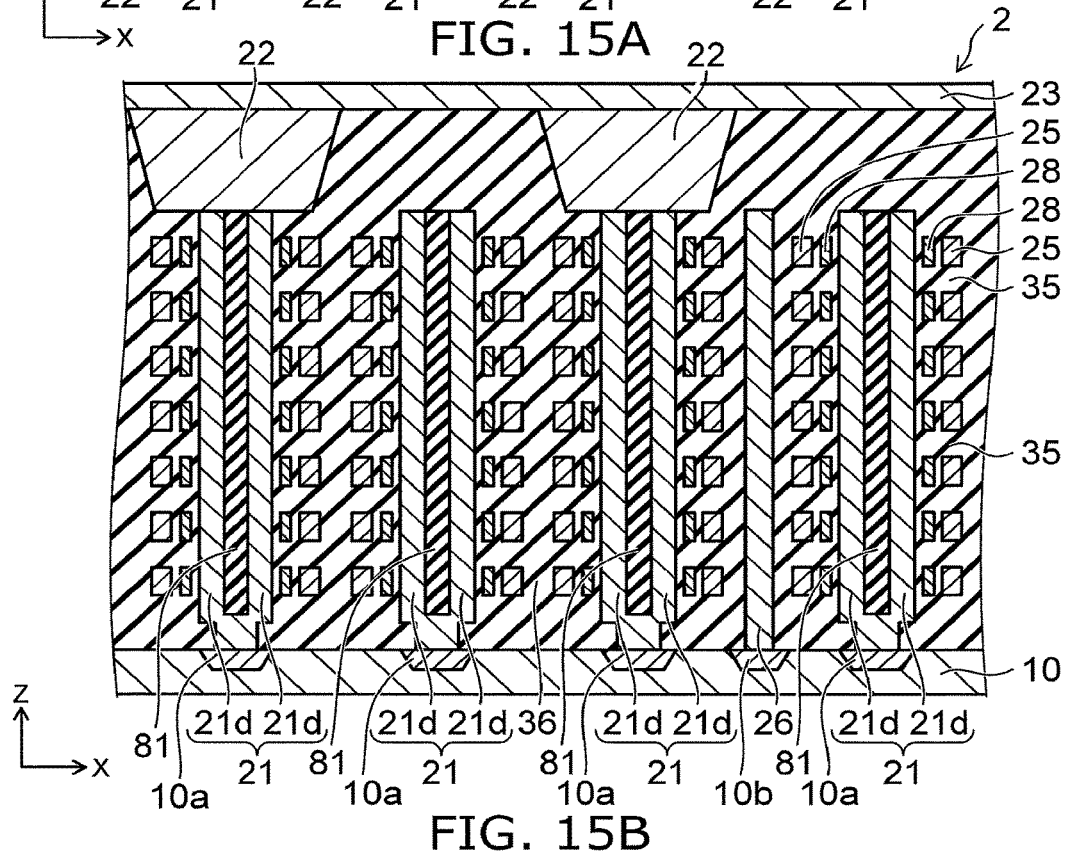
FIG. 15B is a cross-sectional view along line A-A' shown in FIG. 15A.

FIG. 15A is a plan view showing a semiconductor memory device according to the embodiment; and FIG. 15B is a cross-sectional view along line A-A' shown in FIG. 15A.

Figure 16:
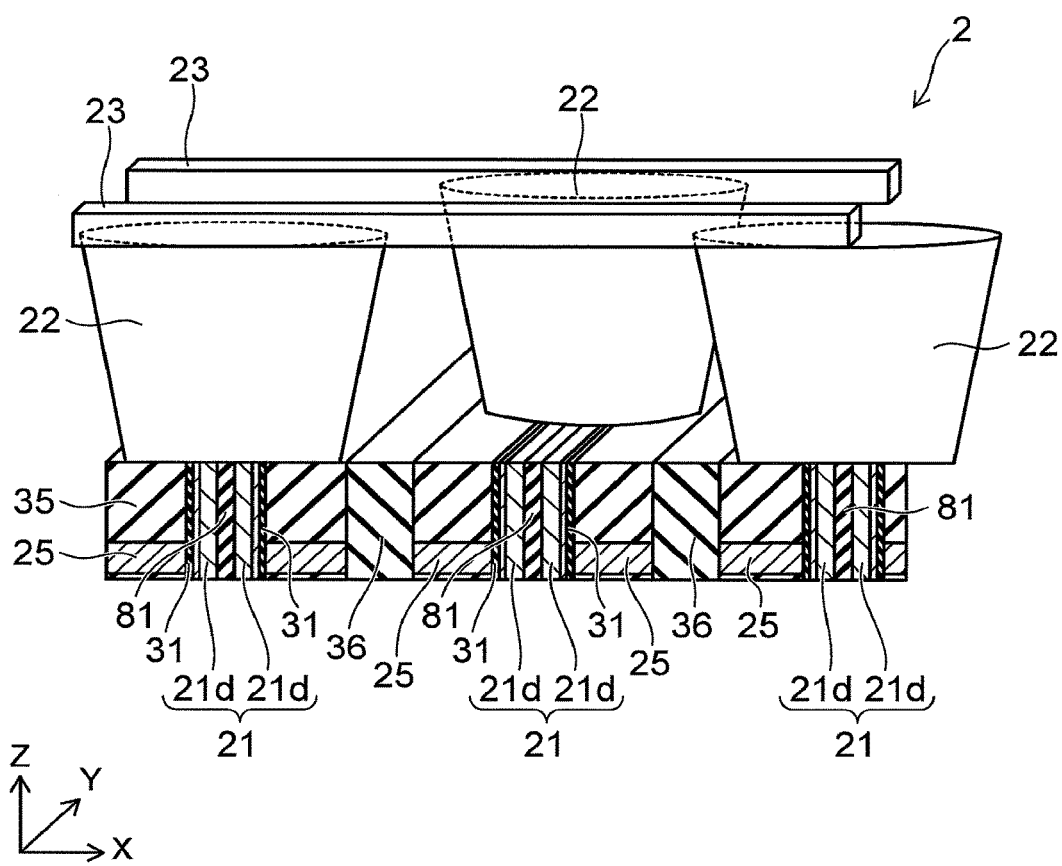
FIG. 16 is a perspective view showing a contact periphery of the semiconductor memory device according to the second embodiment.

FIG. 16 is a perspective view showing the contact periphery of the semiconductor memory device according to the embodiment.

As shown in FIG. 15A and FIG. 15B, the semiconductor memory device 2 according to the embodiment differs from the semiconductor memory device 1 according to the first embodiment described above (referring to FIG. 1A and FIG. 1B) in that an insulating member 81 that extends in the Z-direction is provided inside a space surrounded with the tunneling insulating film 31. The portion of the silicon pillar 21 other than the lower end portion is subdivided into two portions 21d separated in the X-direction by the insulating member 81. The lower end portions of the two portions 21d are connected to each other and connected to the silicon substrate 10; and the upper end portions of the two portions 21d are connected to the same contact 22. The lower end portion of the silicon pillar 21 also may be subdivided into two portions. However, in such a case as well, the upper end portion of each portion is connected to the same contact 22.

According to the embodiment, because the silicon pillar 21 is subdivided into the two portions 21d for each of the word lines 25, the memory cell that is formed at each most proximal portion between the portion 21d and the word lines 25 can be separated from the memory cell formed on the opposite X-direction side of the same silicon pillar 21. Thereby, the stability of the operation improves even further.

Otherwise, the configuration, the manufacturing method, the operations, and the effects of the embodiment are similar to those of the first embodiment described above.

Third Embodiment

A third embodiment will now be described.

Figure 17A:
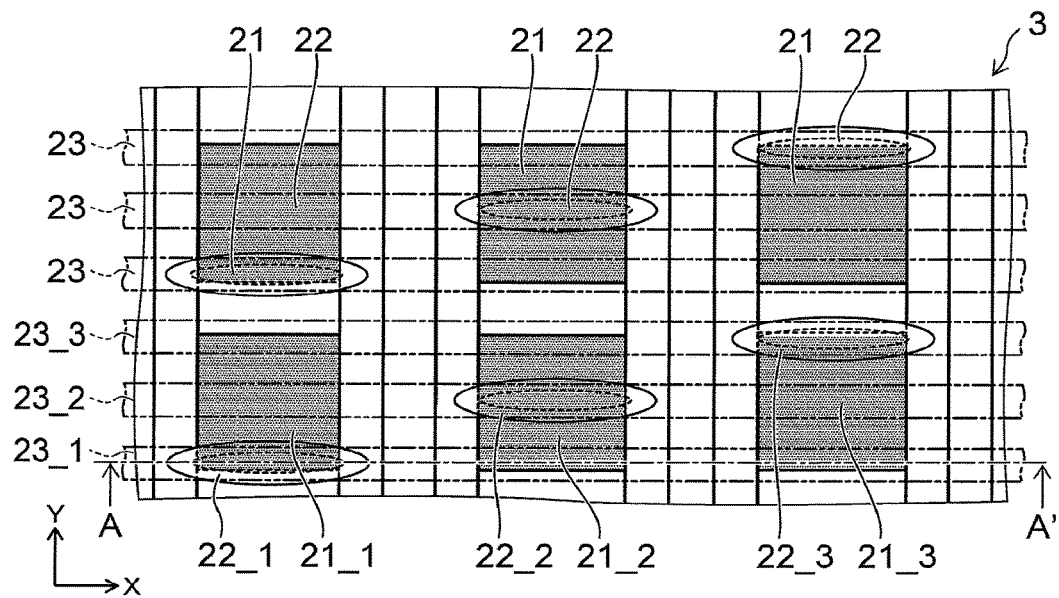
FIG. 17A is a plan view showing a semiconductor memory device according to a third embodiment.
Figure 17B:
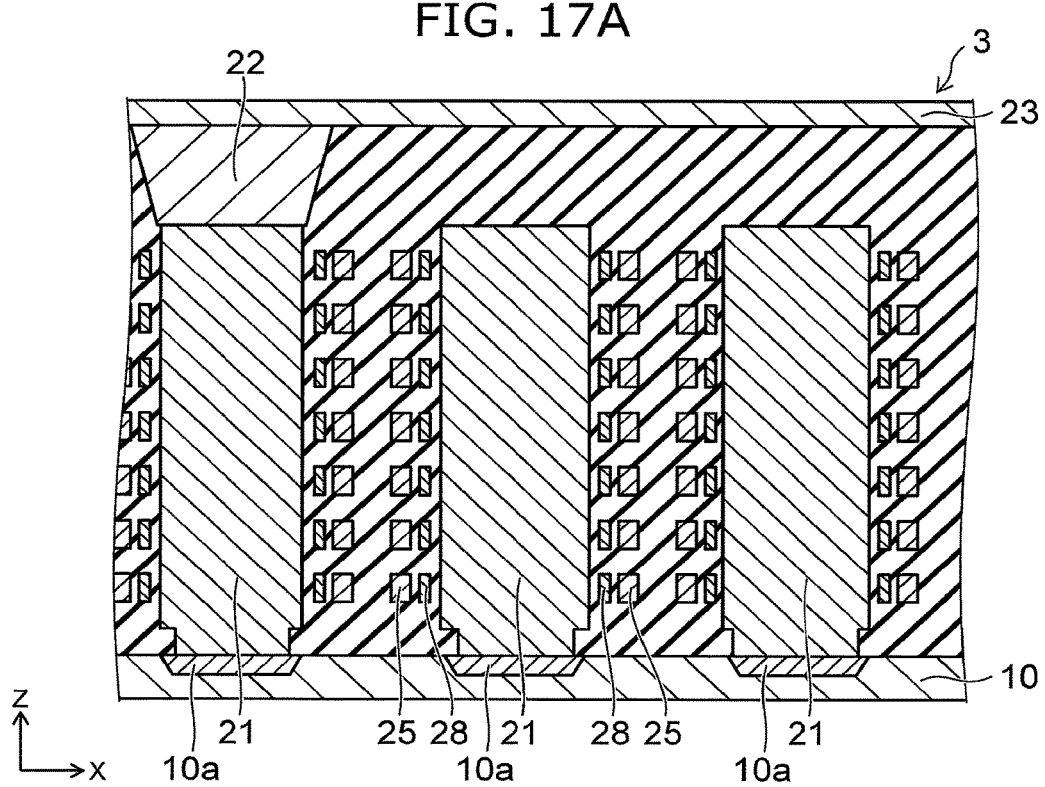
FIG. 17B is a cross-sectional view along line A-A' shown in FIG. 17A.

FIG. 17A is a plan view showing a semiconductor memory device according to the embodiment; and FIG. 17B is a cross-sectional view along line A-A' shown in FIG. 17A.

In the semiconductor memory device 3 according to the embodiment as shown in FIG. 17A and FIG. 17B, the multiple contacts 22 are provided at three positions different from each other in the Y-direction for the silicon pillars 21 arranged in one column along the X-direction. Also, three bit lines 23 are provided to pass through the regions directly above the silicon pillars 21 arranged in one column along the X-direction. To this end, in the Y-direction, the arrangement period of the silicon pillars 21 and the arrangement period of the contacts 22 are 3 times the arrangement period of the bit lines 23. Hereinbelow, the form of such an arrangement of the contacts 22 is called "three-consecutive staggered."

More specifically, when the three silicon pillars 21_1 to 21_3 are consecutively arranged along the X-direction, the contact 22_1 is provided in the region directly above one Y-direction end portion of the silicon pillar 21_1; and the bit line 23_1 that extends in the X-direction is provided to pass through the region directly above the contact 22_1. Thereby, the silicon pillar 21_1 is connected to the bit line 23_1 via the contact 22_1.

Also, the contact 22_2 is provided in the region directly above the Y-direction central portion of the silicon pillar 21_2; and the bit line 23_2 is provided to pass through the region directly above the contact 22_2. Thereby, the silicon pillar 21_2 is connected to the bit line 23_2 via the contact 22_2.

Further, the contact 22_3 is provided in the region directly above the other Y-direction end portion of the silicon pillar 21_3; and the bit line 23_3 is provided to pass through the region directly above the contact 22_3. Thereby, the silicon pillar 21_3 is connected to the bit line 23_3 via the contact 22_3. Also, the configuration of such a basic unit is repeatedly arranged along the X-direction and the Y-direction.

Effects of the embodiment will now be described.

According to the embodiment, the arrangement period of the silicon pillars 21 in the Y-direction can be set to be 3 times the arrangement period of the bit lines 23. Thereby, compared to the first embodiment described above, the patterning having the high aspect ratio for forming the silicon pillars 21 can be even easier. Further, the spacing between the contacts 22 also can be set to be even larger.

Otherwise, the configuration, the manufacturing method, the operations, and the effects of the embodiment are similar to those of the first embodiment described above.

Fourth Embodiment

A fourth embodiment will now be described.

Figure 18:
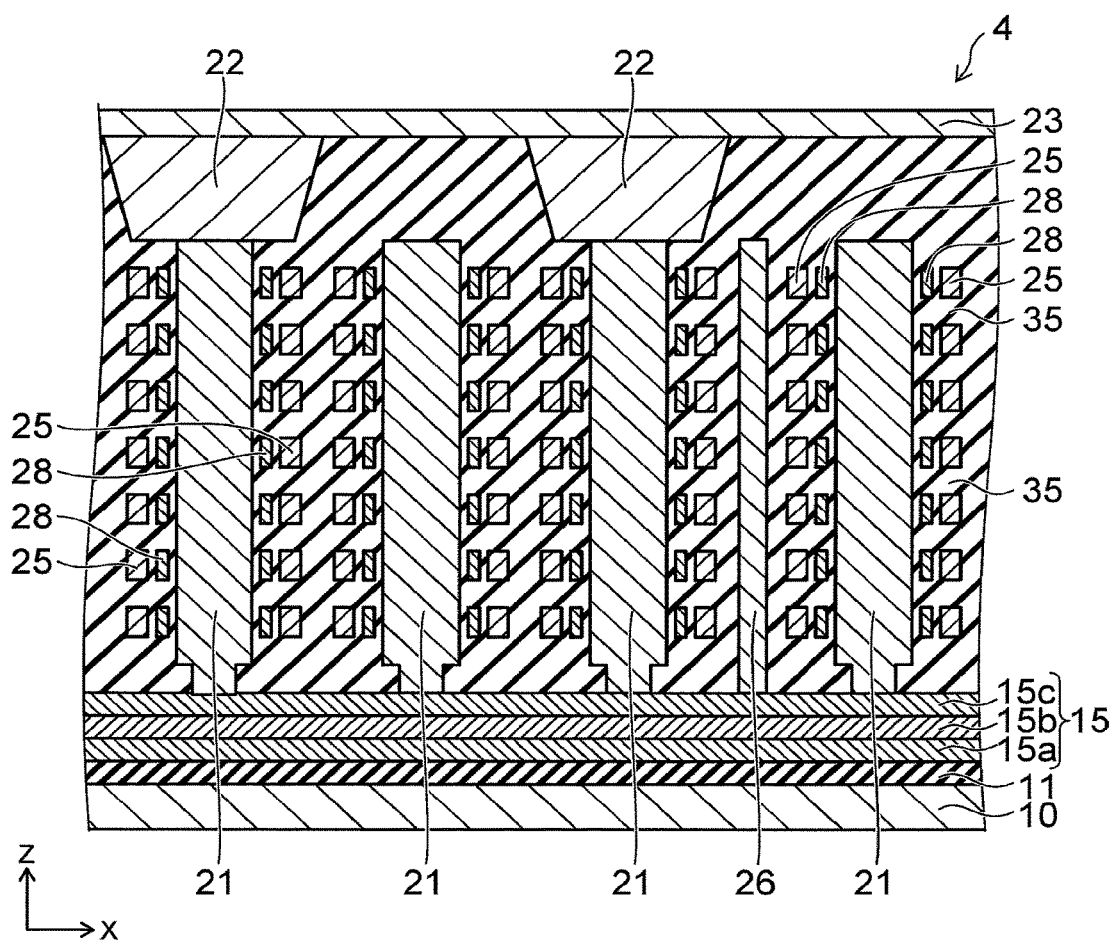
FIG. 18 is a cross-sectional view showing a semiconductor memory device according to a fourth embodiment.

FIG. 18 is a cross-sectional view showing the semiconductor memory device according to the embodiment.

In the semiconductor memory device 4 according to the embodiment as shown in FIG. 18, a cell source line 15 is provided between the silicon substrate 10 and the silicon pillars 21. For example, a polysilicon layer 15a, a tungsten layer 15b, and a polysilicon layer 15c are stacked in this order in the cell source line 15. Then, the lower ends of the silicon pillars 21 and the lower end of the source electrode 26 are connected not to the silicon substrate 10 but to the cell source line 15. An insulating film 11 that is made of, for example, silicon oxide is provided between the silicon substrate 10 and the cell source line 15. The cell source line 15 is insulated from the silicon substrate 10 by the insulating film 11.

Otherwise, the configuration, the manufacturing method, the operations, and the effects of the embodiment are similar to those of the first embodiment described above.

Fifth Embodiment

A fifth embodiment will now be described.

Figure 19:
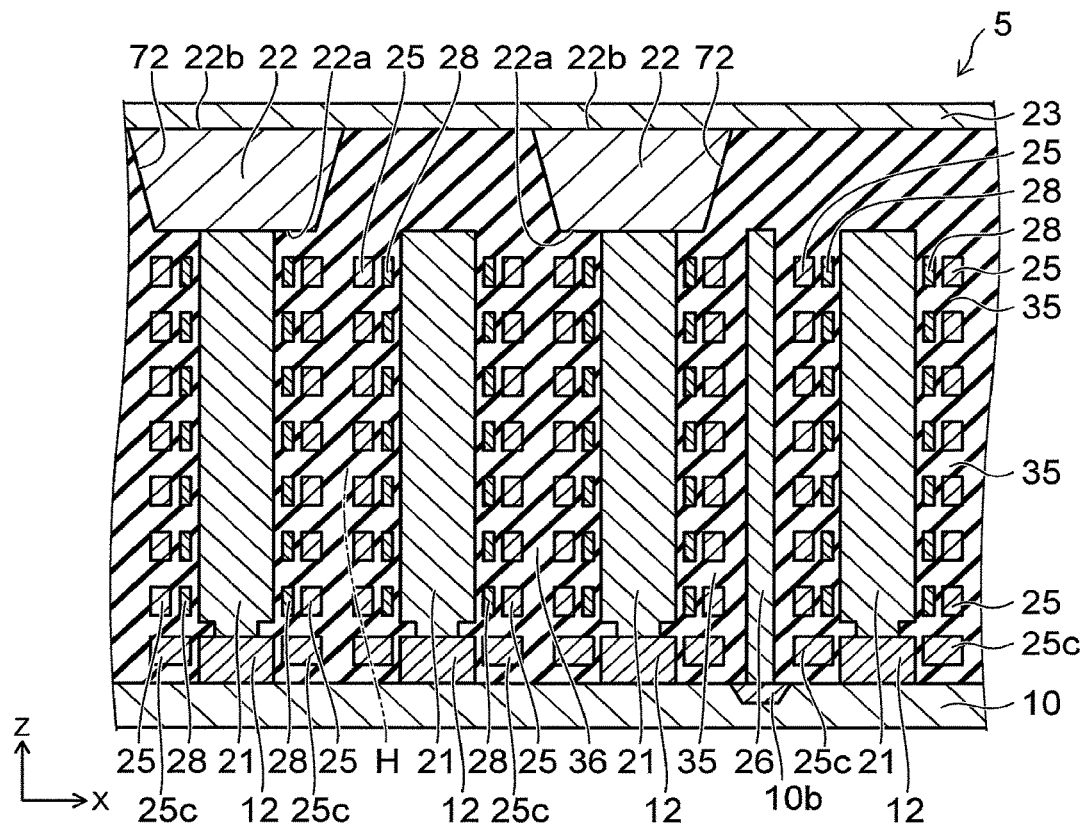
FIG. 19 is a cross-sectional view showing a semiconductor memory device according to a fifth embodiment.

FIG. 19 is a cross-sectional view showing a semiconductor memory device according to the embodiment.

In the semiconductor memory device 5 according to the embodiment as shown in FIG. 19, a silicon epitaxial layer 12 is provided between the silicon substrate 10 and the silicon pillar 21. Also, the floating gate electrodes 28 are not provided on the two X-direction sides of the silicon epitaxial layer 12; and only a word line 25c of one level is provided. The width of the word line 25c in the X-direction is a width that is matched to the word line 25 and the floating gate electrode 28 of the other levels.

A method for manufacturing the semiconductor memory device according to the embodiment will now be described.

Figure 20:
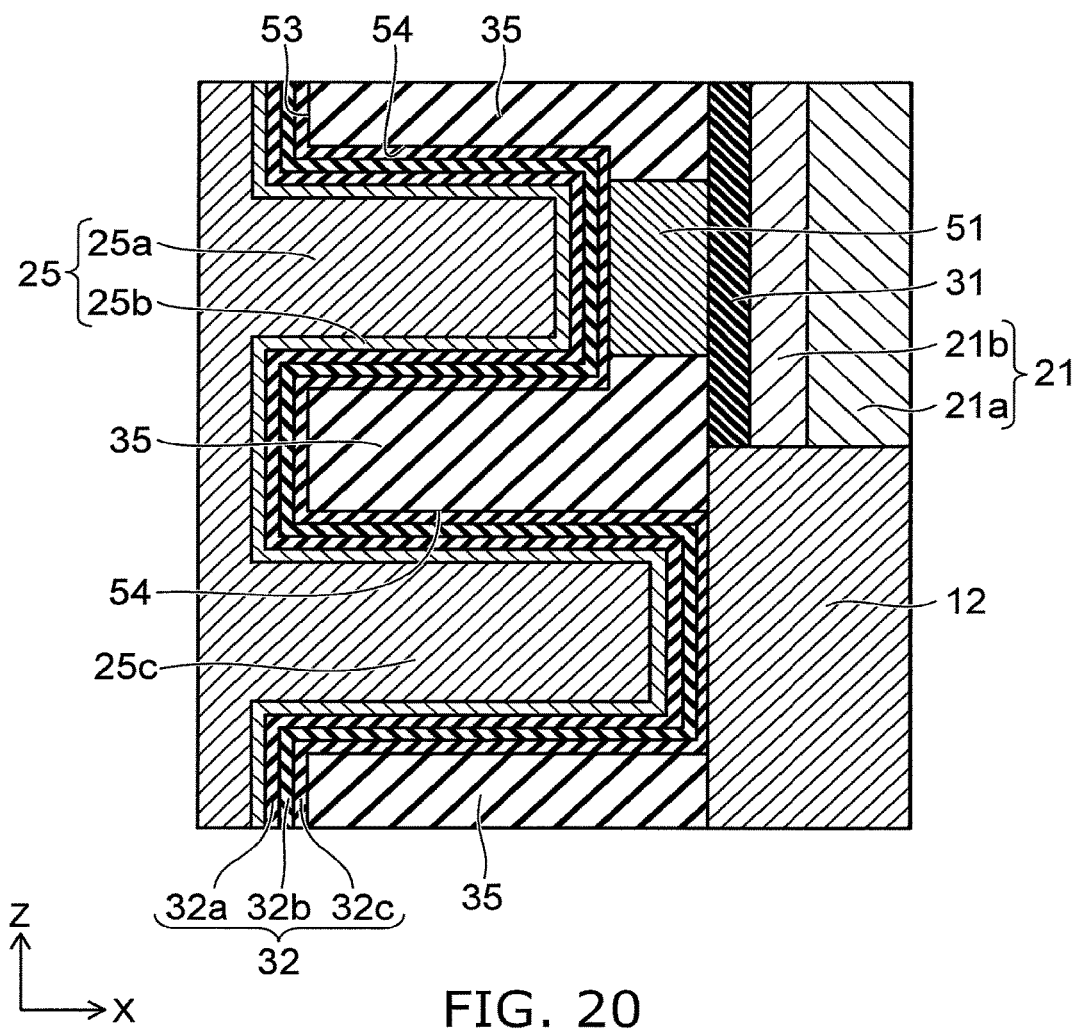
FIG. 20 is a cross-sectional view showing a method for manufacturing the semiconductor memory device according to the fifth embodiment.

FIG. 20 is a cross-sectional view showing the method for manufacturing the semiconductor memory device according to the embodiment.

First, the processes shown in FIG. 4 to FIG. 6 are implemented.

Then, as shown in FIG. 20, the silicon epitaxial layer 12 is formed using the silicon substrate 10 as a seed. At this time, the position of the upper surface of the silicon epitaxial layer 12 is positioned between the sacrificial film 41 of the first level from the bottom and the sacrificial film 41 of the second level from the bottom. Thereby, at the lower portion of the memory hole 46, the recess 47 of the lowermost level is no longer formed; and the floating gate electrode 28 of the lowermost level is no longer formed. On the other hand, the recess 54 of the lowermost level reaches the silicon epitaxial layer 12.

Thereafter, the semiconductor memory device 5 according to the embodiment can be manufactured by a method similar to that of the first embodiment described above.

Otherwise, the configuration, the manufacturing method, the operations, and the effects of the embodiment are similar to those of the first embodiment described above.

Although examples of two-consecutive staggered and three-consecutive staggered are shown in the first to fifth embodiments described above, the invention is not limited thereto and may be four-consecutive staggered or more. The configuration of the semiconductor memory device that is "n-consecutive staggered" can be expressed as follows, where n is an integer of two or more.

Namely, in the semiconductor memory device that is n-consecutive staggered, n contacts 22 are provided on n silicon pillars 21 arranged in one column along the X-direction; and the positions in the Y-direction of the n contacts 22 are different from each other. Also, n bit lines 23 that extend in the X-direction pass through the region directly above each of the silicon pillars 21 for all of the silicon pillars 21. Also, the silicon pillars 21 are connected respectively to the bit lines 23 via the contacts 22.

According to the embodiments described above, a semiconductor memory device can be realized in which the manufacturing is easy and the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
   first and second semiconductor pillars extending in a first direction and being arranged along a second direction crossing the first direction;
   first and second interconnects extending in a third direction and being provided between the first semiconductor pillar and the second semiconductor pillar, the third direction crossing both the first direction and the second direction;
   a first electrode provided between the first semiconductor pillar and the first interconnect;
   a second electrode provided between the second semiconductor pillar and the second interconnect;
   third and fourth interconnects extending in the second direction, the third and fourth interconnects each passing through both a region directly above the first semiconductor pillar and a region directly above the second semiconductor pillar;
   a first contact contacting the first semiconductor pillar and being connected to the third interconnect; and
   a second contact contacting the second semiconductor pillar and being connected to the fourth interconnect.

2. The device according to claim 1, wherein a position of the first contact and a position of the second contact are different from each other in the second direction and the third direction.

3. The device according to claim 1, wherein a length in the second direction of the first contact is longer than a length in the third direction of the first contact.

4. The device according to claim 1, wherein a length of the first contact in the second direction is longer than a length of the first semiconductor pillar in the second direction.

5. The device according to claim 1, wherein a length of the first contact in the third direction is shorter than a length of the first semiconductor pillar in the third direction.

6. The device according to claim 1, further comprising:
   a third semiconductor pillar extending in the first direction and being arranged in the third direction when viewed from the first semiconductor pillar;
   a fourth semiconductor pillar extending in the first direction and being arranged in the third direction when viewed from the second semiconductor pillar;
   a third electrode provided between the third semiconductor pillar and the first interconnect;
   a fourth electrode provided between the fourth semiconductor pillar and the second interconnect;
   fifth and sixth interconnects extending in the second direction, the fifth and sixth interconnects each passing through both a region directly above the third semiconductor pillar and a region directly above the fourth semiconductor pillar;
   a third contact contacting the third semiconductor pillar and being connected to the fifth interconnect; and
   a fourth contact contacting the fourth semiconductor pillar and being connected to the sixth interconnect.

7. The device according to claim 1, wherein
   the first semiconductor pillar includes two portions separated in the second direction, upper end portions of the two portions being connected to the first contact, and
   the second semiconductor pillar includes two portions separated in the second direction, upper end portions of the two portions being connected to the second contact.

8. The device according to claim 1, further comprising:
   a third semiconductor pillar extending in the first direction and being arranged in the second direction when viewed from the first and second semiconductor pillars;
   a fifth interconnect extending in the second direction and passing through the region directly above the first semiconductor pillar, the region directly above the second semiconductor pillar, and a region directly above the third semiconductor pillar; and
   a third contact contacting the third semiconductor pillar and being connected to the fifth interconnect,
   the third and fourth interconnects also passing through the region directly above the third semiconductor pillar.

* * * * *